US 6,489,796 B2

(12) United States Patent
Tomishima

(10) Patent No.: US 6,489,796 B2
(45) Date of Patent: Dec. 3, 2002

(54) SEMICONDUCTOR DEVICE PROVIDED WITH BOOST CIRCUIT CONSUMING LESS CURRENT

(75) Inventor: Shigeki Tomishima, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 23 days.

(21) Appl. No.: 09/754,122

(22) Filed: Jan. 5, 2001

(65) Prior Publication Data

US 2002/0000822 A1 Jan. 3, 2002

(30) Foreign Application Priority Data

Jun. 30, 2000 (JP) .................................. 2000-198797 (P)

(51) Int. Cl.⁷ .............................................. G01R 31/00
(52) U.S. Cl. ..................................... 324/763; 324/158.1
(58) Field of Search ................................. 324/765, 763, 324/158.1, 73.1; 714/733, 734; 327/536, 537

(56) References Cited

U.S. PATENT DOCUMENTS 5,751,158 A  * 5/1998 Loughmiller ................ 324/763
5,999,009 A  * 12/1999 Mitsui .......................... 324/765
6,288,601 B1 * 9/2001 Tomishima .................. 327/536

* cited by examiner

Primary Examiner—Vinh P. Nguyen
(74) Attorney, Agent, or Firm—McDermott, Will & Emery

(57) ABSTRACT

A boosting portion switches between an N channel MOS transistor with high drivability and a P channel MOS transistor with low drivability for transmitting a high potential at an internal node to an output node. The N and P channel MOS transistors are respectively operated when boosted potential Vpp is low and high.

9 Claims, 21 Drawing Sheets

Vpp2 ≧ Vcc+Vth(memo)

Vpp2 ≧ Vcc+2Vthp

SEMICONDUCTOR DEVICE PROVIDED WITH BOOST CIRCUIT CONSUMING LESS CURRENT

BACKGROUND OF THE INVENTION

1. Field of the Invention

The present invention relates to a semiconductor device provided with a potential generating circuit boosting an externally applied power supply potential.

2. Description of the Background Art

Conventionally, a dynamic random access memory (DRAM) is provided with a boost circuit generating a potential higher than an externally applied power supply potential for driving a word line of a memory array.

FIG. 16 is a diagram showing an arrangement of the memory cell of the DRAM.

Referring to FIG. 16, a memory cell MC includes: an N channel MOS transistor 302 connected between a bit line BL and a storage node SN and having its gate connected to a word line; a capacitor 304 having its one end connected to storage node SN and the other end connected to a cell plate potential Vcp.

A substrate of N channel MOS transistor 302 is in most cases set at a negative back gate potential Vbb when a P type substrate is used. Cell plate potential Vcp applied to the other end of the capacitor is in most cases set at a potential half power supply potential Vcc.

Here, assume that an H (High) level is written as data to memory cell MC. Then, power supply potential Vcc is applied to bit line BL and N channel MOS transistor 302 is rendered conductive upon activation of word line WL. Power supply potential Vcc is transmitted to storage node SN.

FIG. 17 is a diagram shown in conjunction with a potential applied to N channel MOS transistor 302 when data at the H level is written to the memory cell.

Referring to FIG. 17, assume that storage node is initially set at a ground potential and then attains to power supply potential Vcc by application of power supply potential Vcc from bit line BL. In this case, N channel MOS transistor 302 has its drain D, source S, and gate G respectively connected to a bit line; storage node SN, and word line. When storage node SN attains to power supply potential Vcc, a large voltage of Vbb−Vcc is applied as a substrate bias voltage Vbs of N channel MOS transistor 302 because of substrate potential Vbb.

Inherently, a threshold voltage Vth of an access transistor used for the memory cell is set at a value greater than a threshold voltage of an N channel MOS transistor used for a usual peripheral circuit to reduce a subthreshold leakage current and to enhance refresh properties. As stated previously, if the source potential and substrate bias voltage Vbs increase, the threshold voltage of N channel MOS transistor 302 increases due to a substrate bias effect.

FIG. 18 is a graph showing a relationship between substrate bias voltage Vbs and threshold voltage Vth.

Referring to FIGS. 17 and 18, assume that the threshold voltage is Vt0 when substrate bias voltage Vbsr of N channel MOS transistor 302 is 0V.

When an L level is written to;storage node SN of the memory cell and the potential at storage node SN is 0V, the value of substrate bias voltage Vbs equals to substrate potential Vbb and threshold voltage Vth equals to threshold voltage Vt1 shown in FIG. 18.

Then, when data at the H level is written to the memory cell, storage node SN attains to potential Vcc, so that substrate bias voltage Vbs equals to |Vbb−Vcc|. Thus, threshold voltage Vth increases to attain to threshold voltage Vt2 shown in FIG. 18.

To enable transmission of power supply potential Vcc at the H level of bit line BL to storage node SN without causing any voltage drop, the potential of word line WL must be set; at a value higher than power supply potential Vcc by threshold voltage Vth.

FIG. 19 is a graph showing a relationship between a voltage written to the memory cell and a potential for activating the word line required therefor.

Referring to FIG. 19, a line G1 represents a potential transmitted to storage node SN of the memory cell. A line G2 represents a value obtained by adding the threshold voltage of the memory cell transistor to the potential of line G1. When 0V at the L level is written to the memory cell, the difference between lines G1 and G2 corresponds to threshold voltage Vt1 shown in FIG. 18. On the other hand, when power supply potential Vcc at the H level is to be written to the memory cell, line G2 becomes higher than line G1 by threshold voltage Vt2. A lower limit of the activation potential actually applied to the word line is obtained by further adding a margin to the potential of line G2 as depicted by a line G3.

The actual activation potential of the word line is set with reference to the case where the writing voltage requiring a high activation potential is power supply potential Vcc. Thus, line G3 equals to that indicating the activation potential of word line WL when power supply potential Vcc is changed.

Namely, the potential required for activation of the word line changes in accordance with the change in power supply potential Vcc and in consideration of the change in the substrate bias effect of the threshold voltage.

The activation potential of word line WL is in most cases boosted potential Vpp obtained by internal boosting.

FIG. 20 is a diagram shown in conjunction with a basic principle of a conventional boost circuit generating boosted potential Vpp.

Referring to FIG. 20, a boost circuit 310 includes: a diode 312 having its anode and cathode respectively connected to power supply potential Vcc and a node N11 for precharging node N11 to power supply potential Vcc; an oscillation circuit 316 generating a clock signal for a boosting operation; a capacitor 314 having its one end and the other end respectively connected to node N11 and an output of clock generation circuit 316; and a diode 318 having it anode connected to node N11 and cathode outputting boosted potential Vpp. When node N11 is precharged to power supply potential Vcc by diode 312 for precharging, node N11 is boosted to a value twice power supply potential Vcc from power supply potential Vcc by a clock signal generated by oscillation circuit 316 of which L and H levels respectively correspond to a ground potential and power supply potential Vcc. The boosted potential is output as boosted potential Vpp through diode 318.

It is noted that the foregoing description ignores a voltage drop in a forward direction due to diodes 312 and 318 for simplification.

FIG. 21 is a circuit diagram showing an actual arrangement of a boost circuit.

Referring to FIG. 21, a boost circuit 320 includes capacitors 321 and 322 having their one ends receiving clock signals CLK. The other end of capacitor 321 is connected to a node N12. The other end of capacitor 322 is connected to a node N13.

Boost circuit 320 further includes: an N channel MOS transistor 324 diode-connected to N12 from a node to which power supply potential Vcc is applied; an N channel MOS transistor 326 diode-connected to N13 from the node to which power supply potential Vcc is applied; and an N channel MOS transistor 328 connected between nodes N12 and N14 and having its gate connected to node N13 and its back gate supplied with substrate potential Vbb. Boosted potential Vpp is output from node N14.

Before operation, nodes N12 and N13 are precharged to power supply potential Vcc or a potential lower than power supply potential Vcc by a threshold voltage of the N channel MOS transistor. The precharge is performed by N channel MOS transistors 324 and 326 which are diode-connected.

Clock signal CLK is input, and the potential at one ends of capacitors 321 and 322 are boosted to power supply potential Vcc from 0V.

Then, nodes N12 and N13 attain to a potential twice power supply potential Vcc from power supply potential Vcc due to capacitive coupling. The potential twice power supply potential Vcc at node N12 is supplied to node N14 through N channel MOS transistor 328. At the time, boosted potential Vpp decreases by threshold voltage Vthn of N channel MOS transistor 328.

Namely, in the circuit shown in FIG. 21, the high potential at node N12 is decreased by the threshold voltage of N channel MOS transistor 328 for output.

Next, a conventional boost circuit capable of outputting higher boosted potential Vpp will be described.

FIG. 22 is a circuit diagram showing an arrangement of boost circuit 330.

Referring to FIG. 22, boost circuit 330 uses an N channel MOS transistor 334 having a triple-well structure for outputting boosted potential Vpp. N channel MOS transistor 334 has its back gate connected to a node N15.

FIG. 23 is a cross sectional view showing N channel MOS transistor 334.

Referring to FIG. 23, an N well 344 is formed in a main surface of a P substrate 342, and a P well 345 is formed in N well 344. N well 344 is connected to node N15 through an N type impurity region 346. P well 345 is connected to node N15 through a P type impurity region 350. Further, N channel MOS transistor MOS transistor 334 is formed in a main surface of P well 345. N channel MOS transistor 334 includes N type impurity regions 352 and 354 as well as a gate electrode 356. Impurity region 352 is connected to node N15, and a capacitor 332 is connected between gate electrode 356 and node NIB. Boosted potential Vpp is output from impurity region 354.

Node N15 is connected to P well 345 through impurity region 350. The potential at node N15 is transmitted to impurity region 354 through a PN junction between impurity region 354 and P well 345. Accordingly, the node at Vpp attains to a potential lower by a Pn junction voltage Vjv from a potential twice power supply potential Vcc. However, generally, since the PN junction voltage Vjv is lower than threshold voltage Vth of N channel MOS transistor 334, a higher boosted potential can be generated than in the case of the circuit shown in FIG. 21.

FIG. 24 is a circuit diagram showing an arrangement of a conventional boost circuit 360 capable of outputting still higher boosted potential.

Referring to FIG. 24, boost circuit 360 includes; a capacitor 362 having its one end supplied with clock signal CLK and the other end connected to a node N16; a level converting portion 364 having its input receiving clock signal CLK for amplifying the amplitude thereof for output; a capacitor 366 connected between an output of level converting portion 364 and a node N17; and N channel MOS transistor 368 having its gate connected to node N17 and outputting a boosted potential at node N16 as boosted potential Vpp when it is rendered conductive. N channel MOS transistor 368 has its back gate connected to a substrate potential Vbb.

FIG. 25 is a circuit diagram showing an arrangement of level converting portion 364 shown in FIG. 24.

Referring to FIG. 25, level converting portion 364 includes: an inverter 372 receiving and inverting an input signal IN; an N channel MOS transistor 374 connected between a ground node and a node N18 and having its gate receiving an input signal IN, an N channel MOS transistor 376 connected between a node N19 and the ground node and having its gate receiving an output from inverter 372; a P channel MOS transistor 378 connected between a node to which boosted potential Vpp is applied and node N18 and having its gate connected to node N19; and a P channel MOS transistor 380 connected between the node to which boosted potential Vpp is applied and node N19 and having its gate connected to node N18. An output signal OUT obtained by amplifying the amplitude of input signal IN is output from node N19.

Returning to FIG. 24, the operation of boosted circuit 360 will briefly be described. The gate potential of N channel MOS transistor 368 is boosted to a potential higher than a potential twice power supply potential Vcc by an output from level converting portion 364. Accordingly, the potential twice power supply potential Vcc at node N16 can be output as boosted potential Vpp without causing any potential drop.

FIG. 26 is a circuit diagram showing an arrangement of another boost circuit 380 which has been modified as in the case of boost circuit of FIG. 24.

Referring to FIG. 26, boost circuit 380 includes: a capacitor 382 having its one end supplied with clock signal CLK and the other end connected to a node N20; an inverter 384 receiving and inverting clock signal CLK; a capacitor 386 having its one end supplied with clock signal CLK and the other end connected to a node N21; a diode 388 precharging node N21 to power supply potential Vcc; a P channel MOS transistor 390 connected between nodes N21 and N22 and having its gate receiving an output from inverter 384; and an N channel MOS transistor 392 connected between node N22 and a ground node and having its gate receiving an output from inverter 384.

Boost circuit 380 further includes: a capacitor 394 connected between nodes N22 and N23; a diode 396 for precharging node N23 to power supply potential Vcc; and an N channel MOS transistor 398 connected between nodes N20 and N24 and having its gate connected to a node N23. Boosted potential Vpp is output from node N24.

FIG. 27 is a diagram showing waveforms in conjunction with the operation of boost circuit 380.

Referring to FIGS. 26 and 27, in the initial state, nodes N21 and N23 are precharged to power supply potential Vcc respectively by diodes 388 and 396. Then, when clock signal CLK rises from 0V to power supply potential Vcc, the potential at node N21 is boosted to a potential twice power supply potential Vcc from power supply potential Vcc. The potential is transmitted to node N22, and the potential at node N23 is boosted to a potential three times power supply potential Vcc from power supply potential Vcc by capacitive coupling of capacitor 394. More specifically, the potential at node N23 which has conventionally been set twice the power supply potential can be boosted to the potential three times power supply potential Vcc. Accordingly, the potential twice the power supply potential generated by capacitor 382 at node N20 can be transmitted by N channel MOS transistor 398 having its gate receiving the potential three times the power supply potential without causing any potential drop.

FIG. 28 is a circuit diagram showing an arrangement of a boost circuit 400 which uses a P channel MOS transistor at an output portion.

Referring to FIG. 28, boost circuit 400 includes: inverters 404 and 406 connected in series and receiving clock signal CLK; a capacitor 408 having its one end connected to an output from inverter 406 and the other end connected to a node N25; a level converting circuit 402 receiving clock signal CLK and converting the level thereof for output to node N26; and asp P channel MOS transistor 410 connected between nodes N25 and N27 and having its gate connected to a node N26.

P channel MOS transistor 410 has its back gate connected to a node N27. Boosted potential Vpp is transmitted from node N27. Boosted potential Vpp is also supplied to level converting circuit 402.

FIG. 29 is a circuit diagram showing an arrangement of level converting circuit 402.

Referring to FIG. 29, level converting circuit 402 includes: an inverter 412 receiving and inverting an input signal IN; an N channel MOS transistor 414 having its gate receiving input signal IN and connected between node N21 and a ground node; an N channel MOS transistor 416 connected between a node N29 and the ground node and having its gate receiving an output from inverter 412; a P channel MOS transistor 418 connected between a node to which boosted potential Vpp is applied and a node N28 and having its gate connected to a node N29; and a P channel MOS transistor 420 connected between the node to which boosted potential Vpp is applied and node N29 and having its gate connected to node N28.

Level converting circuit 402 further includes: a P channel MOS transistor 424 connected between the node to which boosted potential Vpp is applied and a node N30 and having its gate connected to N29; and an N channel MOS transistor 422 connected between node N30 and the ground node and having its gate connected to node N29. An output signal OUT from level converting circuit 402 is output from node N30.

Returning to FIG. 28, the operation of a boost circuit 400 will briefly be described.

Before operation, node N25 is precharged to power supply potential Vcc or a potential lower than power supply potential Vcc by the threshold voltage.

Then, a pulse is applied to clock signal CLK and the potential at node N25 is boosted to a potential twice power supply potential Vcc by capacitive coupling of capacitor 408.

At the time, a signal obtained by inverting a clock signal CLK is applied to the gate of N channel MOS transistor 410 by level converting circuit 402. The amplitude of the inverted signal has been amplified to attain to boosted potential Vpp from 0V. When the potential at node N25 attains to 2Vcc, the potential at node N26 attains to 0V. P channel MOS transistor 410 is rendered conductive for outputting the potential at node N25 without causing any potential drop. When clock signal CLK is at the L level, node N26 attains to boosted potential Vpp, and P channel MOS transistor 410 is rendered non-conductive.

FIG. 30 is a circuit diagram showing an arrangement of another exemplary boost circuit 430 which uses a P channel MOS transistor at an output portion.

Referring to FIG. 30, boost circuit 430 includes: inverters 434 and 436 connected in series and receiving clock signal CLK; a capacitor 438 having its one end supplied with an output of inverter 436 and the other end connected to a node N31; an inverter 432 receiving and inverting clock signal CLK; a capacitor 440 having its one end receiving an output of inverter 432 and the other end connected to a node N32; an N channel MOS transistor 442 diode-connected in a forward direction to a node supplied with power supply potential Vcc from node N31; an N channel MOS transistor 444 diode-connected in a forward direction to a node supplied with power supply potential Vcc from N32; and a P channel MOS transistor 446 connected between nodes N31 and N33 and having its gate connected to node N32. P channel MOS transistor 446 has its back gate connected to a node N33, from which boosted potential Vpp is output.

The operation of boost circuit 430 will briefly be described. First, before operation, node N31 is precharged to power supply potential Vcc or a potential lower than the power supply potential by the threshold voltage. When clock signal CLK changes from the L to H level, the potential at node N31 is boosted to a potential twice power supply potential Vcc by a capacitive coupling of capacitor 438.

At the time, the potential at node N32 is precharged by N channel MOS transistor 444 even if the potential is to decrease due to the capacitive coupling of capacitor 440. Thus, it is maintained at power supply potential Vcc. Namely, P channel MOS transistor 446 is rendered conductive since node N31 is twice the power supply potential and the gate is at power supply potential Vcc. Thus, the potential twice the power supply potential is transmitted to node N33 without causing any voltage drop.

On the other hand, when clock signal CLK falls from the H to L level, node N31 is precharged by N channel MOS transistor 442 and attains to power supply potential Vcc. Node N32 attains to the potential twice power supply potential Vcc due to the capacitive coupling of capacitor 440. Namely, the gate potential equals to boosted potential Vpp, so that P channel MOS transistor 446 is rendered non-conductive.

FIG. 31 is a schematic diagram shown in conjunction with a load circuit connected to the boost circuit.

Referring to FIG. 31, boosted potential Vpp output from boost circuit 310, previously described with reference to FIG. 19, is used as a power supply potential of a circuit which requires a boosting level such as a word driver 452 or a row decoder 454 of the DRAM. When the access operation of the DRAM starts, boosted potential Vpp decreases due to current consumption. If the potential is kept at a decreased level, the potential of the word line driven by word driver 452 does not sufficiently increase, or a time required for driving the word line increases. As a result, performance degradation or malfunction is caused.

If boost circuit 310 is always operated to maintain the level of boosted potential Vpp high, however, the DRAM generally consumes a greater amount of current. Then, measures are taken to reduce the amount of current consumed.

FIG. 32 is a block diagram showing an arrangement of generating boosted potential Vpp employed in the conventional case.

Referring to FIG. 32, a detector circuit 462 for monitoring boosted potential Vpp is arranged. Detector circuit 462 operates a ring oscillator 464 by an activation signal /OE to generate a clock signal when boosted potential Vpp decreases. Responsively, boost circuit 466 boosts boosted potential Vpp by a pumping operation. When boosted potential attains at least to a set potential, detector circuit 462 inactivates ring oscillator 464 to stop clock signal CLK and the pumping operation of boost circuit 466. Further, when a row-related command which causes semiconductor memory device to receive boosted potential Vpp and consume a large amount of current is input, for example, boost circuit 468 activated in synchronization with input control signal /RAS may be arranged.

FIG. 33 is a circuit diagram showing a first example of detector circuit 462 shown in FIG. 32.

Referring to FIG. 33, a detector circuit 462a of the first example includes: an N channel MOS transistor 472 connected between a node N34 supplied with boosted potential Vpp and a node N35 and having its gate connected to power supply potential Vcc; and a resistor 474 connected between node N35 and the ground node. Control signal /OE of an activation signal is output from node N35.

A transistor having a large threshold voltage is for example used for a memory array portion of N channel MOS transistor 472. In the case of detector circuit 462a, control signal /OE is controlled such that boosted potential Vpp equals to Vcc+Vth (memo). It is noted that threshold voltage Vth (memo) is a threshold voltage of N channel MOS transistor 452.

FIG. 34 is a circuit diagram showing a second example of detector circuit 462.

Referring to FIG. 34, a detector circuit 462b includes: a P channel MOS transistor 476 connected between node N34 supplied with boosted potential Vpp and node N36 and having its gate connected to node N36; a P channel MOS transistor 478 connected between nodes N36 and N35 and having its gate connected to power supply potential Vcc; and a resistor 480 connected between node N35 and a ground node. A control signal /OE is output from node N35.

In the case of detector circuit 462b, control signal /OE is controlled such that boosted potential Vpp equals to Vcc+2Vthp. It is noted that Vthp is a threshold voltage of P channel MOS transistors 476 and 478.

More specifically, when boosted potential Vpp falls below a set value, P channel MOS transistors 476 and 478 are rendered conductive and control signal /OE attains to the H level. When boosted potential Vpp attains at least to the set value, P channel MOS transistors 456 and 458 are rendered non-conductive and node N35 attains to the L level because of resistor 460, so that control signal /OE also attains to the L level.

Recently, the devices with the DRAMs are required to consume less power. Thus, in the DRAMs, externally applied power supply potential Vcc is becoming lower. Here, a DRAM operating with a low power supply voltage will be considered.

FIG. 35 is a graph showing a relationship between a power supply potential and a boosted potential.

Referring to FIG. 35, Vpp equals to Vcc at any point on a line G10, and Vpp equals to 2Vcc at any point on a line G14.

In the conventional boost circuit which has been described above, even an ideal circuit can generate Vpp as low as twice power supply potential Vcc. Namely, the level of boosted potential Vpp has a slope which is twice as sharp as the change in power supply potential Vcc. To write power supply potential Vcc to the memory cell, the activation potential of the word line must be a potential (a line G11) higher by the threshold voltage of the memory cell. In addition, an operation margin, control margin and the like are required, so that the potential of a line G13 is necessary for actually driving the word line of the memory cell. Namely, the boost circuit must output a potential higher than that of line G13.

However, even in the ideal boost circuit, boosted potential Vpp, i.e., an output potential, has a slope twice as sharp as that of power supply potential Vcc. Thus, a decrease in power supply potential Vcc results in a sharp decrease in the output potential. Then, a required potential (line G13) and the supplied potential (line G14) become equal at a point A. Therefore, a potential required for driving the word line cannot be generated on the lower voltage side of point A.

To achieve a circuit capable of ideally outputting a potential twice as power supply potential Vcc, conventionally, a triple-well process as shown in FIGS. 21 and 22 is used, the number of circuit elements is increased as shown FIGS. 23 and 25 to increase the gate potential, or the P channel MOS transistor is used at the output portion to prevent the decrease by the threshold voltage as shown in FIGS. 26 and 28. However, any of these measures suffer from the problems that the process becomes complicated, the number of circuit elements increases, or the element size of the P channel MOS transistor with less mobility increases, thereby resulting in increase in the layout area.

SUMMARY OF THE INVENTION

An object of the present invention is to provide a semiconductor device provided with a boost circuit which is capable of generating a suitable boosted potential Vpp even when an externally applied power supply voltage is low and which is advantageous in terms of the number of circuit, layout area, current consumption and process.

In short, the present invention is a semiconductor device provided with a voltage detecting portion, a clock signal generation circuit, and a boosting portion.

The voltage detecting portion detects a potential at a first node supplied with a boosted potential. The clock signal generation circuit generates an source clock signal in accordance with an output from the detection circuit. The boosting portion boosts an external power supply potential in accordance with the source clock signal for applying it to the first node.

The boosting portion includes: a precharge circuit precharging a second node to a prescribed potential; a boost circuit boosting the potential at the second node in accordance with the source clock signal; a first field effect transistor of a first conductivity type connected between the first and second nodes; a first driving circuit driving the gate potential of the first field effect transistor in accordance with the source clock signal; a second field effect transistor of a second conductivity type connected between the first and second nodes; and a second driving circuit driving the gate potential of the second field effect transistor in accordance with the source clock signal.

Therefore, a main advantage of the present invention is that a driver formed by the P channel MOS transistor is also used together with a driver formed by the N channel MOS transistor, so that a high boosted potential can be supplied while avoiding a problem of voltage drop by the threshold voltage of the driver, which is caused in the case of the N channel MOS transistor.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
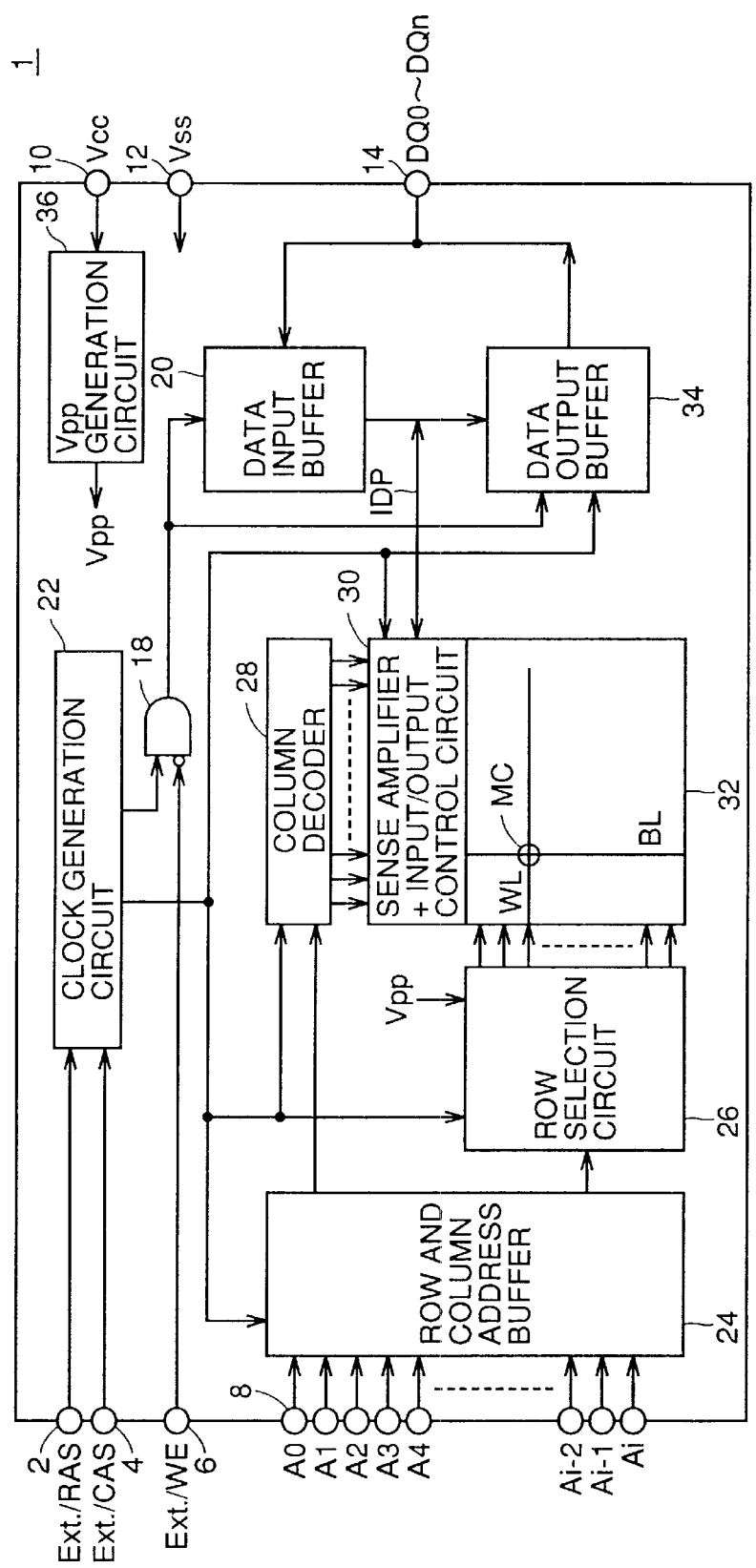
FIG. 1 is a schematic block diagram showing an arrangement of a semiconductor memory device 1 according to an embodiment of the present invention.

The embodiment of the present invention will now be described in detail with reference to the drawings. It is noted that the same or corresponding portions are denoted by the same reference characters throughout the drawings.

FIG. 1 is a schematic block diagram showing an arrangement of a semiconductor memory device 1 according to the embodiment of the present invention.

Referring to FIG. 1, semiconductor memory device 1 includes: control signal input terminals 2, 4, 6 respectively receiving control signals Ext./RAS, Ext./CAS and Ext./WE; an address input terminal group 8; a terminal group 14 for inputting/outputting data signals DQ0 to DQn; a ground terminal 12 supplied with a ground potential Vss; and a power supply terminal 10 supplied with an external power supply potential Vcc.

Semiconductor memory device 1 further includes: a clock generation circuit 22; a row and column address buffer 24; a row selection circuit 26; a column decoder 28; a sense amplifier+input/output control circuit 30; a memory cell array 32; a gate circuit 18; a data input buffer 20; and a data output buffer 34.

Clock generation circuit 22 generates a control clock corresponding to a prescribed operation mode based on external row and column address strobe signals Ext./RAS and Ext./CAS which are externally applied through control signal input terminals 2 and 4, so as to generally control the operation of the semiconductor memory device.

Row and column address buffer 24 applies address signals generated in accordance with externally applied address signals A0 to Ai (i is a natural number) to row selection circuit 26 and column decoder 28.

Memory cell MC in memory cell array 32 that is designated by row selection circuit 26 and column decoder 28 externally inputs/outputs data signals DQ0 to DQn to/from input/output terminal 14 through sense amplifier+input/output control circuit 30 and data input buffer 20 or data output buffer 34.

Semiconductor memory device 1 further includes a Vpp generation circuit 36 receiving and internally boosting external power supply potential Vcc applied to power supply terminal 10 for outputting boosted potential Vpp. Boosted potential Vpp is, applied to row selection circuit 26 and further applied to word line WL of the memory array or the like.

Figure 2:
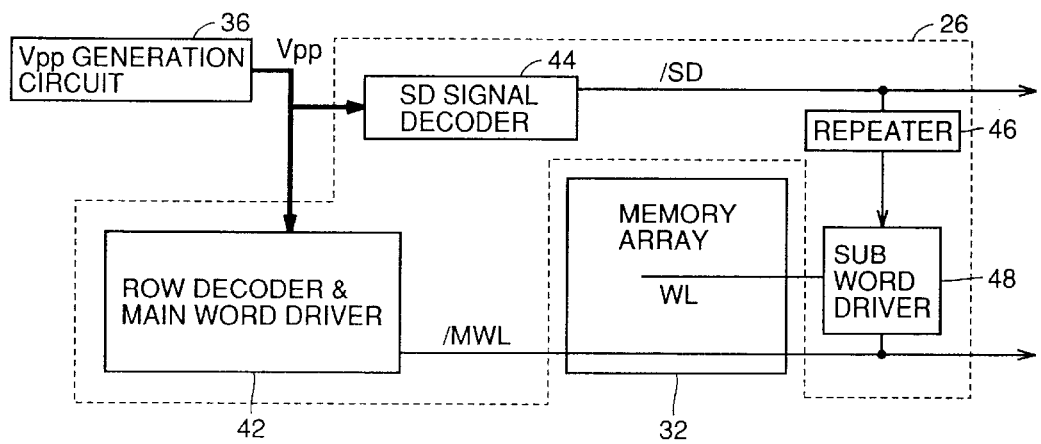
FIG. 2 is a block diagram shown in conjunction with a structure of a row select circuit 26 of FIG. 1.

FIG. 2 is a block diagram shown in conjunction with an arrangement of row selection circuit 26 of FIG. 1.

Referring to FIG. 2, row selection circuit 26 includes: a row decoder & main word driver 42 receiving boosted potential Vpp output from Vpp generation circuit 36 as an operation power supply potential for outputting a main word line drive signal/MWL; an SD signal decoder 44 outputting a sub decode signal/SD; a repeater 46 receiving and buffering sub decode signal/SD; and a sub word driver 48 driving word line WL in accordance with an output from repeater 46 and main word line drive signal /MWL.

Figure 3:
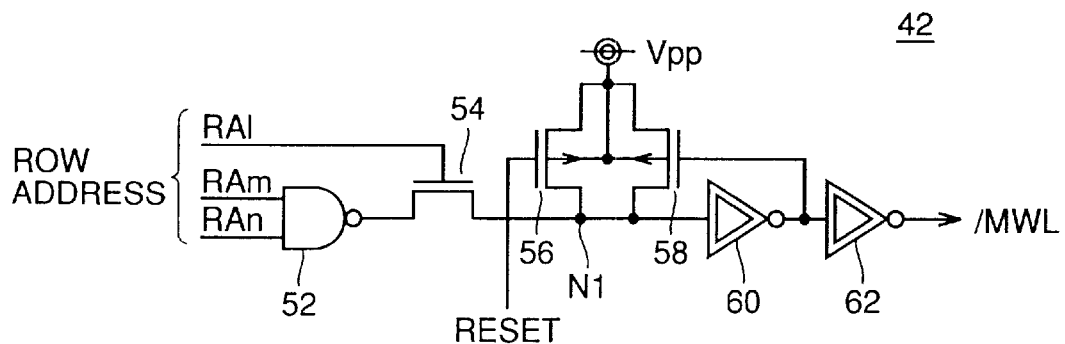
FIG. 3 is a circuit diagram showing a schematic arrangement of a row decoder & main word driver 42 in FIG. 2.

FIG. 3 is a circuit diagram showing a schematic arrangement of row decoder & main word driver 42 of FIG. 2.

Referring to FIG. 3, row decoder & main word line driver 42 includes: an NAND circuit 52 receiving row address signals RAm, RAn; an N channel MOS transistor 54 rendered conductive in accordance with a row address signal RA1 for transmitting an output from NAND circuit 52 to a node N1; a P channel MOS transistor 56 connecting node N1 to boosted potential Vpp in accordance with a reset signal RESET; a P channel MOS transistor 58 connected between node N1 and a node supplied with boosted potential Vpp; and inverters 60, 62 connected in series and having their inputs connected to node N1.

P channel MOS transistors 56, 58 have their back gates supplied with boosted potential Vpp. An output from inverter 60 is applied to the gate of P channel MOS transistor 58. An output from inverter 62 turns to main word line drive signal/MWL.

It is noted that the symbols of inverters 60, 62 represent that these inverters receive boosted potential Vpp as the operation power supply potential for operation.

Figure 4:
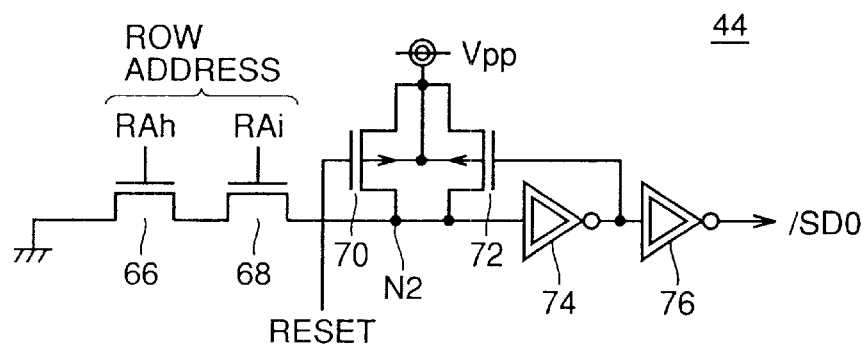
FIG. 4 is a circuit diagram showing an arrangement of an SD signal decoder 44 of FIG. 2.

FIG. 4 is a circuit diagram showing an arrangement of SD signal decoder 44 of FIG. 2.

Referring to FIG. 4, SD signal decoder 44 includes: N channel MOS transistors 68, 66 connected in series between a node N2 and a ground node; a P channel MOS transistor 70 connecting node N2 to boosted potential Vpp in accordance with reset signal RESET; a P channel MOS transistor 72 connected in series between node N2 and a node supplied with boosted potential Vpp; and inverters 74, 76 connected in series and having their inputs connected to node N2. P channel MOS transistors 70, 72 have their back gates supplied with boosted potential Vpp. An output from inverter 74 is applied to the gate of P channel MOS transistor 72, and an output from inverter 76 turns to a sub decode signal/SD0.

It is noted that inverters 74, 76 receive boosted potential Vpp as the operation power supply potential.

Figure 5:
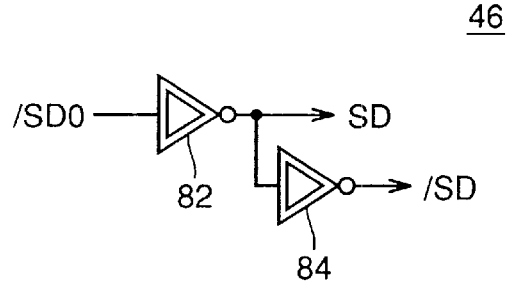
FIG. 5 is a circuit diagram showing an arrangement of a repeater 46 of FIG. 2.

FIG. 5 is a circuit diagram showing an arrangement of repeater 46 of FIG. 2.

Referring to FIG. 5, repeater 46 includes: an inverter 82 receiving and inverting sub decode signal/SD0 for outputting sub decode signal SD; and an inverter 84 receiving and inverting sub decode signal SD for outputting sub decode signal/SD.

It is noted that inverters 82, 84 receive boosted potential Vpp as the operation power supply potential for operation.

Figure 6:
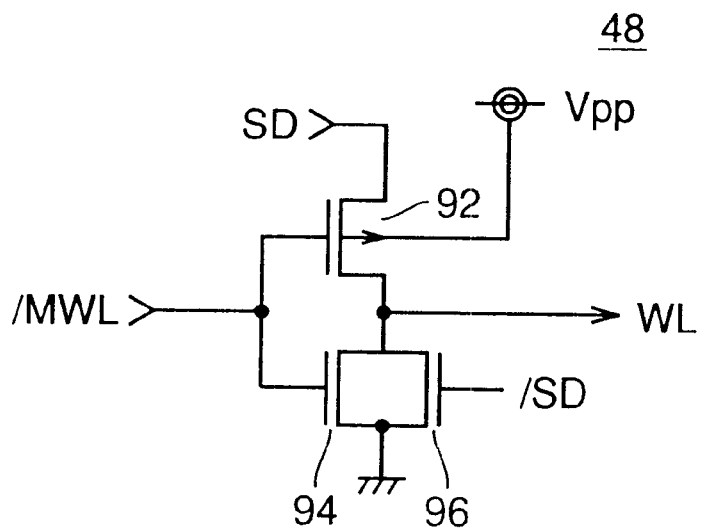
FIG. 6 is a circuit diagram showing an arrangement of a sub word driver 48 of FIG. 2.

FIG. 6 is a circuit diagram showing an arrangement of sub word driver 48 of FIG. 2.

Referring to FIG. 6, sub word driver 48 includes: a P channel MOS transistor 92 transmitting sub decode signal SD to word line WL in accordance with main word line drive signal/MWL; an N channel MOS transistor 94 rendered conductive when main word line drive/MWL is at an H level for connecting word line WL to a ground node; and an N channel MOS transistor 96 rendered conductive when sub decode signal/SD is at the H level for connecting word line WL to the ground node. P channel MOS transistor 92 has its back gate supplied with the boosted potential Vpp.

Figure 7:
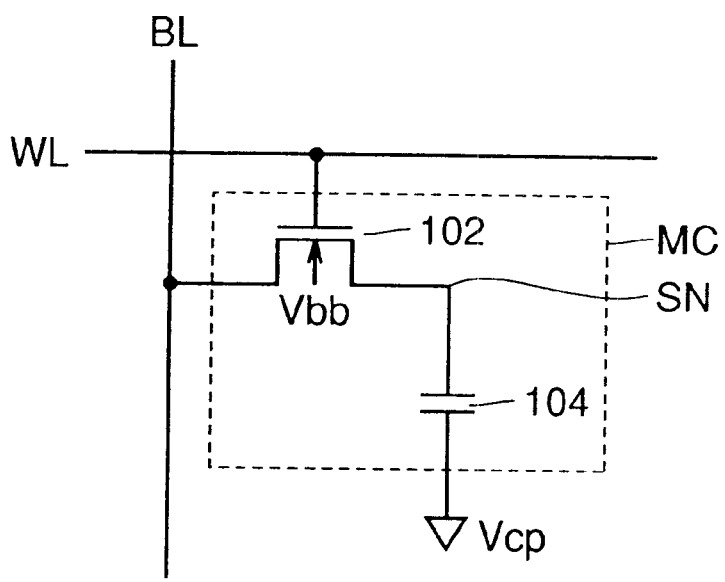
FIG. 7 is a circuit diagram shown in conjunction with an arrangement of a memory cell MC of FIG. 1.

FIG. 7 is a circuit diagram shown in conjunction with an arrangement of memory cell MC of FIG. 1.

Referring to FIG. 7, memory cell MC includes: an N channel MOS transistor 102 having its gate connected to word line WL and connected between bit line BL and storage node SN; and a capacitor 104 having its one end connected to storage node SN and the other end connected to a cell plate potential Vcp.

Figure 8:
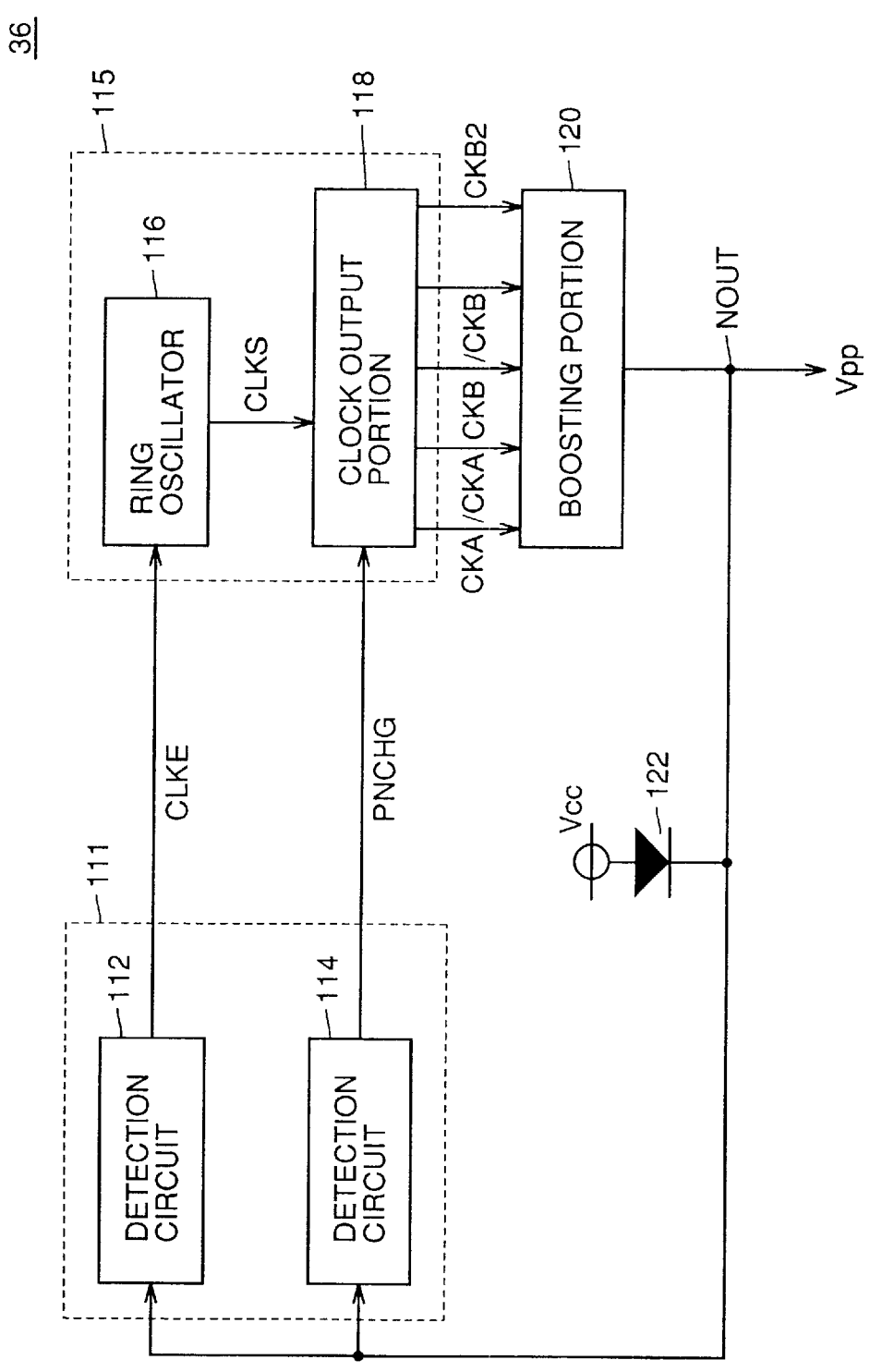
FIG. 8 is a block diagram showing an arrangement of a Vpp generation circuit 36 of FIG. 1.

FIG. 8 is a block diagram showing an arrangement of Vpp generation circuit 36 of FIG. 1.

Referring to FIG. 8, Vpp generation circuit 36 includes: a voltage detection circuit 111 detecting the level of boosted potential Vpp; a clock signal generation circuit 115 outputting a plurality of clock signals in accordance with an output from voltage detection circuit 111; and a boosting portion 120 generating boosted potential Vpp in accordance with an output from clock signal generation circuit 115.

Voltage detection circuit 111 includes detection circuits 112 and 114. Detection circuit 112 outputs a control signal CLKE controlling generation of the clock signal in accordance with boosted potential Vpp. Detection circuit 114 outputs control signal PNCHG in accordance with boosted potential Vpp.

Clock signal generation circuit 115 includes: a ring oscillator 116 generating clock signal CLKS in accordance with control signal CLKE; and a clock output portion 118 outputting clock signals CKA, /CKA, CKB, /CKB, and CKB2 in accordance with control signal PNCHG and clock signal CLKS.

Vpp generation circuit 36 further includes a boosting portion 120 outputting boosted potential Vpp in accordance with clock signal CLKS output from clock output portion 118. It is noted that an output node NOUT of boosting portion 120 is precharged by a diode 122 to power supply potential Vcc before the Vpp generation circuit starts its operation.

Figure 9:
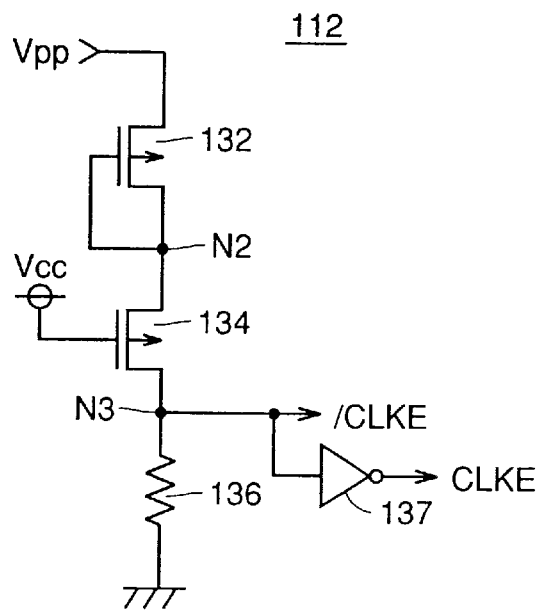
FIG. 9 is a circuit diagram showing an arrangement of a detecting circuit 112 of FIG. 8.

FIG. 9 is a circuit diagram showing an arrangement of detection circuit 112 of FIG. 8.

Referring to FIG. 9, detection circuit 112 includes: a P channel MOS transistor 132 connected between the node supplied with boosted potential Vpp and node N2 and having its gate connected to node N2; a P channel MOS transistor 134 connected between nodes N2 and N3 and having its gate connected to power supply potential Vcc; and a resistor 136 connected between a node N3 and the ground node. It is noted that a control signal/CLKE is output from node N3. Detection circuit 112 further includes an inverter 137 receiving and inverting control signal/CLKE for outputting control signal CLKE.

Figure 10:
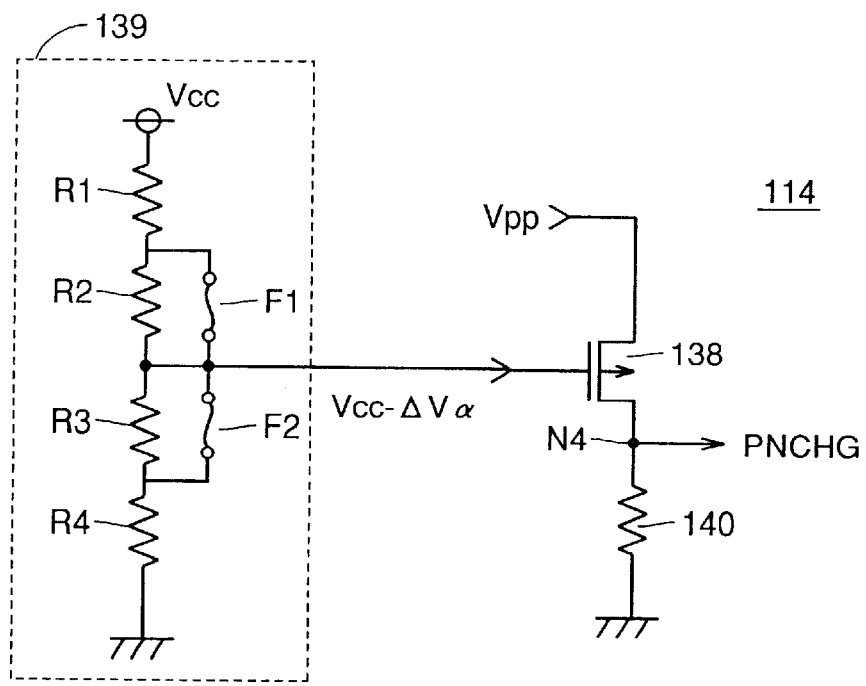
FIG. 10 is a circuit diagram showing an arrangement of a detecting circuit 114 of FIG. 8.

FIG. 10 is a circuit diagram showing an arrangement of detection circuit 114 of FIG. 8.

Referring to FIG. 10, detection circuit 114 includes: a P channel MOS transistor 138 connected between the node supplied with boosted potential Vpp and a node N4; and a resistor 140 connected between node N4 and the ground node. P channel MOS transistor 138 has its gate supplied with a potential of Vcc−ΔVα. Control signal PNCHG is output from node N4.

Detection circuit 114 further includes a potential generation circuit 139 generating the potential of Vcc−ΔVα for applying it to the gate of P channel MOS transistor 138. Potential generation circuit 139 includes: resistors R1 to R4 connected in series between the node supplied with power supply potential Vcc and the ground node; a fuse element F1 connected in parallel with resistor R2; and a fuse element F2 connected in parallel with resistor R3. Vcc−ΔVα, i.e., an output potential of potential generation circuit 139, is output from a connection node of resistors R2 and R3. It is noted that the output potential, of potential generation circuit 139 is determined in principle by resistance division of resistors R1 and R4. Blowing fuse element F1 decreases the output potential, whereas blowing fuse element F2 increases the output potential. By selectively blowing the fuse, the value of detection voltage Vdet1 can be controlled which switches between P and N channel MOS transistors for driving, as will later be described.

Figure 11:
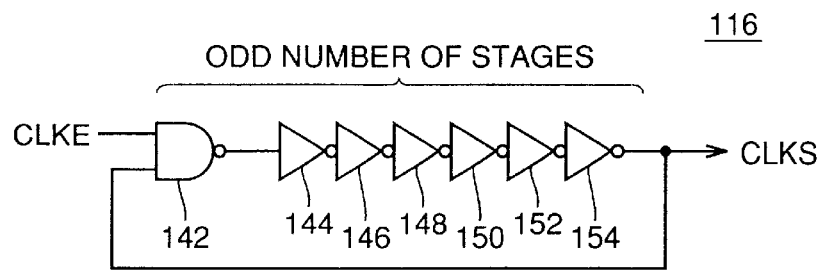
FIG. 11 is a circuit diagram showing an exemplary circuit of a ring oscillator 116 of FIG. 8.

FIG. 11 is a circuit diagram showing an exemplary circuit of ring oscillator 116 of FIG. 8.

Referring to FIG. 11, ring oscillator 116 includes: an NAND circuit 142 having its one input receiving control signal CLKE and the other input receiving clock signal CLKS; and inverters 144 to 154 connected in series for receiving an output from NAND circuit 142. An output from inverter 154 is clock signal CLKS. It is noted that NAND circuit 142 and inverters 144 to 154 perform inversion of an odd number of stages in total and, therefore, when clock signal CLKE attains to the H level, ring oscillator 116 performs self-oscillation for outputting clock signal CLKS.

Figure 12:
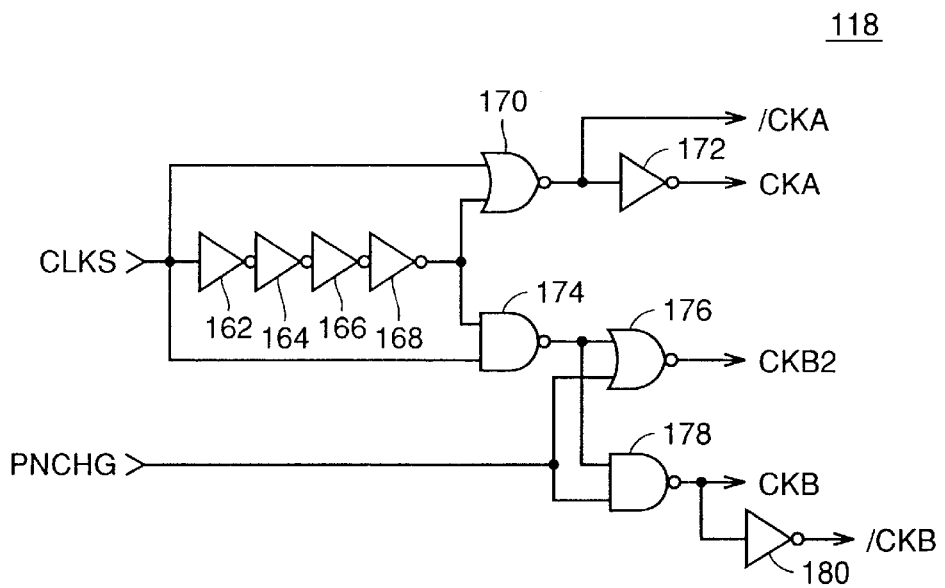
FIG. 12 is a circuit diagram showing an arrangement of a clock output portion 118 of FIG. 8.

FIG. 12 is a circuit diagram showing an arrangement of clock output portion 118 of FIG. 8.

Referring to FIG. 12, clock output portion 118 includes: inverters 162 to 168 connected in series for receiving clock signal CLKS; an NOR circuit 170 receiving clock signal CLKS and an output from inverter 168 for outputting a clock signal/CKA; and an inverter 172 receiving and inverting clock signal/CKA for outputting clock signal CKA.

Clock output portion 118 further includes: an NAND circuit 174 receiving clock signal CLKS and an output from inverter 168; an NOR circuit 176 receiving an output from NAND circuit 174 and control signal PNCHG for outputting a clock signal CKB2; an NAND circuit 178 receiving an output from NAND circuit 174 and control signal PNCHG for outputting clock signal CKB; and an inverter 180 receiving and inverting clock signal CKB for outputting clock signal/CKB.

Figure 13:
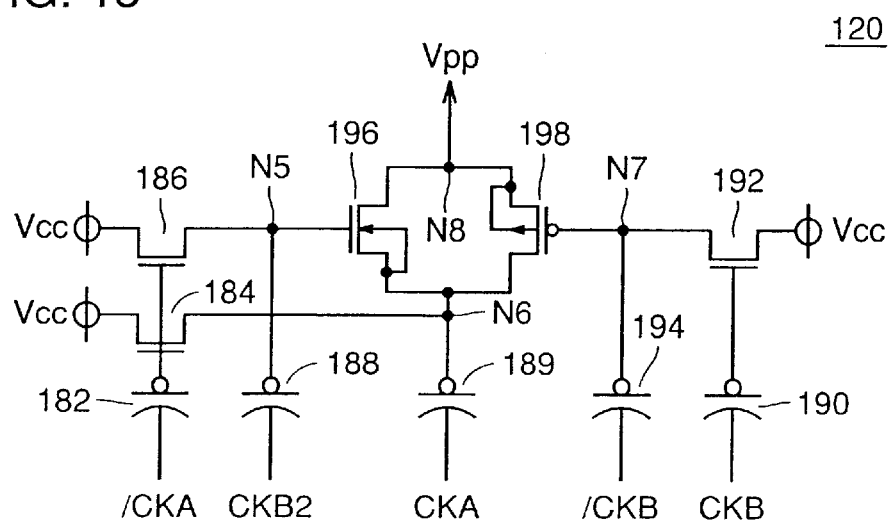
FIG. 13 is a circuit diagram showing an arrangement of a boosting portion 120 of FIG. 8.

FIG. 13 is a circuit diagram showing an arrangement of boosting portion 120 of FIG. 8.

Referring to FIG. 13, boosting portion 120 includes: a capacitor 182 having its one end supplied with clock signal/CKA; an N channel MOS transistor 184 connected between the node supplied with power supply potential Vcc and a node N6 and having its gate connected to the other end of capacitor 182; an N channel MOS transistor 186 connected between the node supplied with power supply potential Vcc and node N5 and having its gate connected to the other end of capacitor 182; a capacitor 188 having its one end supplied with clock signal CKB2 and the other end connected to node N5; a capacitor 189 having its one end supplied with clock signal CKA and the other end connected to node N6; a capacitor 194 having its one end supplied with clock signal/CKB and the other end connected to a node N7; and capacitor 190 having its one end supplied with clock signal CKB.

Boosting portion 120 further includes: an N channel MOS transistor 192 having its connected to the other end of capacitor 190 and connected between the node supplied with power supply potential Vcc and node N7; a P channel MOS transistor 198 having its gate connected to node N7 and connected between nodes N8 and N6; and an N channel MOS transistor 196 having its gate connected to node N5 and connected between nodes N8 and N6.

N channel MOS transistor 196 has its back gate connected to node N6, whereas P channel MOS transistor has its back gate connected to node N8. Boosted potential Vpp is output from node N8.

In an output stage of boosting portion 120, transistors of opposite conductivity types, i.e., P and N channel MOS transistors 198 and 196, are arranged in parallel as a driver circuit of the last stage.

The potential at node N6 which has been precharged to power supply potential Vcc by N channel MOS transistor 184 is boosted in accordance with clock signal CKA by capacitive coupling of capacitor 189. Then, the potential at node N6 is boosted to a potential twice power supply potential Vcc. Electric charges are supplied to node N8 through P channel MOS transistor 198 and N channel MOS transistor 196, which are the last driver transistors.

Similarly, the potential at node N7, which has been precharged to power supply potential Vcc by N channel MOS transistor 192, is further boosted in accordance with clock signal CKB by capacitive coupling of capacitor 194. The potential at node N7 is boosted to the potential twice power supply potential Vcc and P channel MOS transistor 198 is rendered non-conductive. Then, when the gate potential of N channel MOS transistor 192 attains to the H level in accordance with a change in clock signal CKB, node N7 is connected to power supply potential Vcc and P channel MOS transistor 198 is rendered conductive.

Likewise, the potential at node N5, which has been charged to power supply potential Vcc by N channel MOS transistor 186, is further boosted by capacitive coupling of capacitor 188 in accordance with a change in clock signal CKB2. The potential at node N5 is boosted to attain to a potential twice power supply potential Vcc and, N channel MOS transistor 196 is rendered conductive. However, when the gate potential of N channel MOS transistor 186 which is capacitively coupled to clock signal/CKA by capacitor 182 attains to the H level, the potential at node N5 attains to power supply potential Vcc, and N channel MOS transistor 196 is rendered non-conductive. The above mentioned operation allows boosting portion 120 to supply the potential at node N6, which has become twice power supply potential Vcc by clock signal CKA, to node N8 by transistors 196 and 198.

Figure 14:
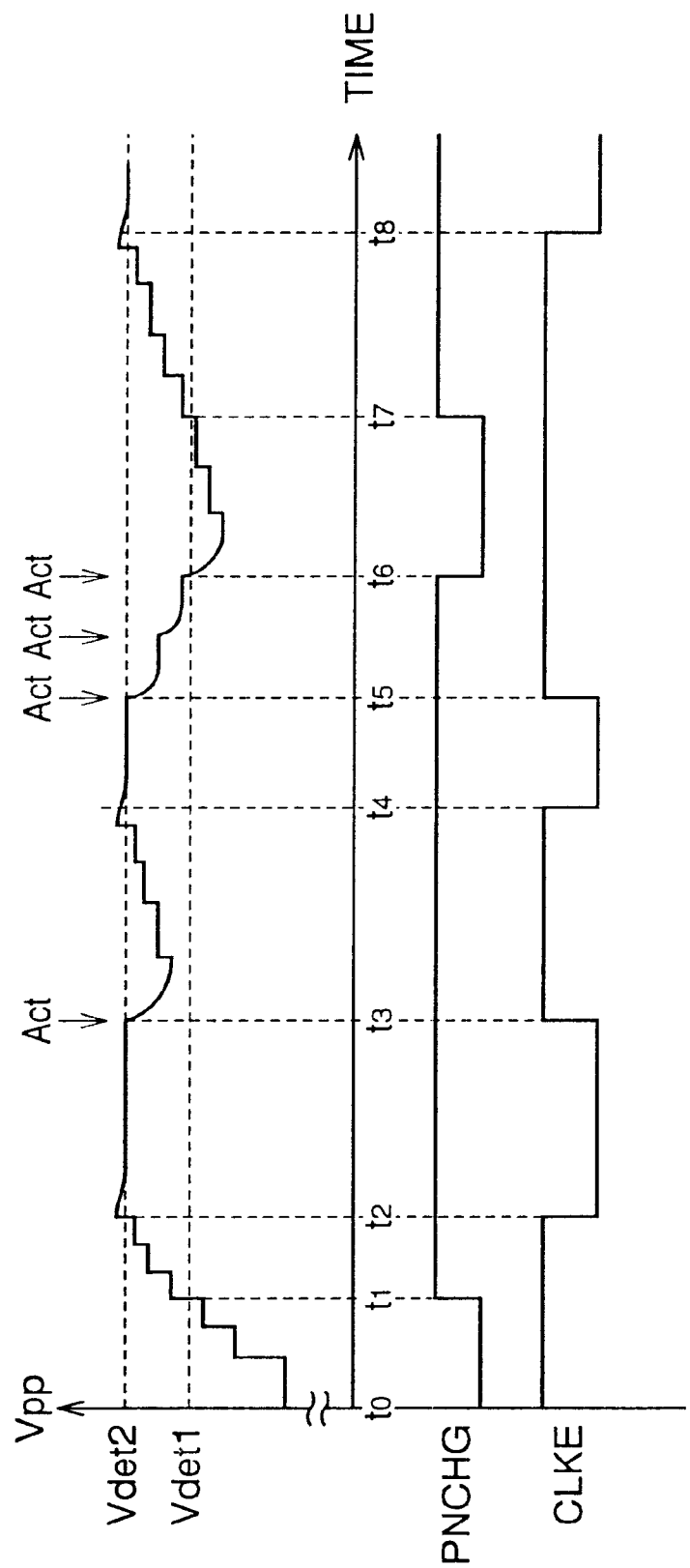
FIG. 14 is a diagram showing waveforms used for explaining the operation of Vpp generation circuit 36.

FIG. 14 is a diagram showing waveforms used for explaining the operation of Vpp generation circuit 36.

Referring to FIGS. 8 and 14, at a time t0, Vpp generation circuit 36 starts its operation and the potential begins to rise from power supply potential Vcc, i.e., an initial voltage. At the time, control signal CLKE output from detection circuit 112 is at the H level, and control signal PNCHG output from detection circuit 114 is at the L level. Thus, ring oscillator 116 outputs clock signal CLK from time t0 to a time t1, and clock output portion 118 activates clock signals CKA, /CKA and CKB2. On the other hand, clock signals CKB and /CKB are inactivated.

At the time t1, if boosted potential Vpp exceeds a first detection potential Vdet1, detection circuit 114 detects the change in potential and rises control signal PNCHG to the H level from the L level. Responsively, clock output portion 118 inactivates clock signal CKB2 and activates clock signals CKB and /CKB while keeping clock signals CKA and /CKA in the active state. Then, the gate potential of N channel MOS transistor 196 of FIG. 13 is fixed and P channel MOS transistor 198 is rendered conductive for transmitting the potential at node N6 to node N8. Thus, the potential at node N6 is transmitted to node N8 by N channel MOS transistor 196 with high mobility when the potential is low. When the potential exceeds a prescribed value, only the gate potential of P channel MOS transistor 198 with low mobility is driven to reduce power consumption of the Vpp generation circuit per se.

When boosted potential Vpp reaches a target potential Vdet2 at a time t2, detection circuit 112 detects the change in potential and control signal CLKE falls from the H to L level. Then, Vpp generation circuit 36 stops its operation, so that current consumption is reduced.

When the memory is accessed only once at a time t3, boosted potential Vpp temporarily decreases. In a synchronous DRAM, for example, row related activation is performed when an active command ACT is input. If the potential does not fall below detection potential Vdet1, only detection circuit 112 changes the control signal and, responsively, P channel MOS transistor 198 is driven to bring boosted potential Vpp back to a target potential.

When the boosted potential returns to a target value at a time t4, control signal CLKE is again inactivated by detection circuit 112, and Vpp generation circuit 36 stops its operation.

When the memory is sequentially accessed from a time t5 to a time t6, boosted potential Vpp falls below detection potential Vdet1. Then, detection circuit 116, along with detection circuit 112, change the control signal. The potential returns to a target value rapidly by the operation of the driver transistor on the side of the N channel MOS transistor with high mobility from time t6 to a time t7. When the boosted potential exceeds detection potential Vdet1, the P channel MOS transistor with low mobility is used for driving from time t7 to a time t8.

It is noted that a drivability can also be adjusted by the size of the MOS transistor, i.e., a ratio of a gate length to a channel length. Thus, two transistors of different sizes may be arranged in parallel with each other, where boosted potential Vpp is boosted from external power supply potential Vcc to detection potential Vdet1 by the larger transistor and boosted potential Vpp is maintained between detection potentials Vdet2 and Vdet1 by the smaller transistor.

Figure 15:
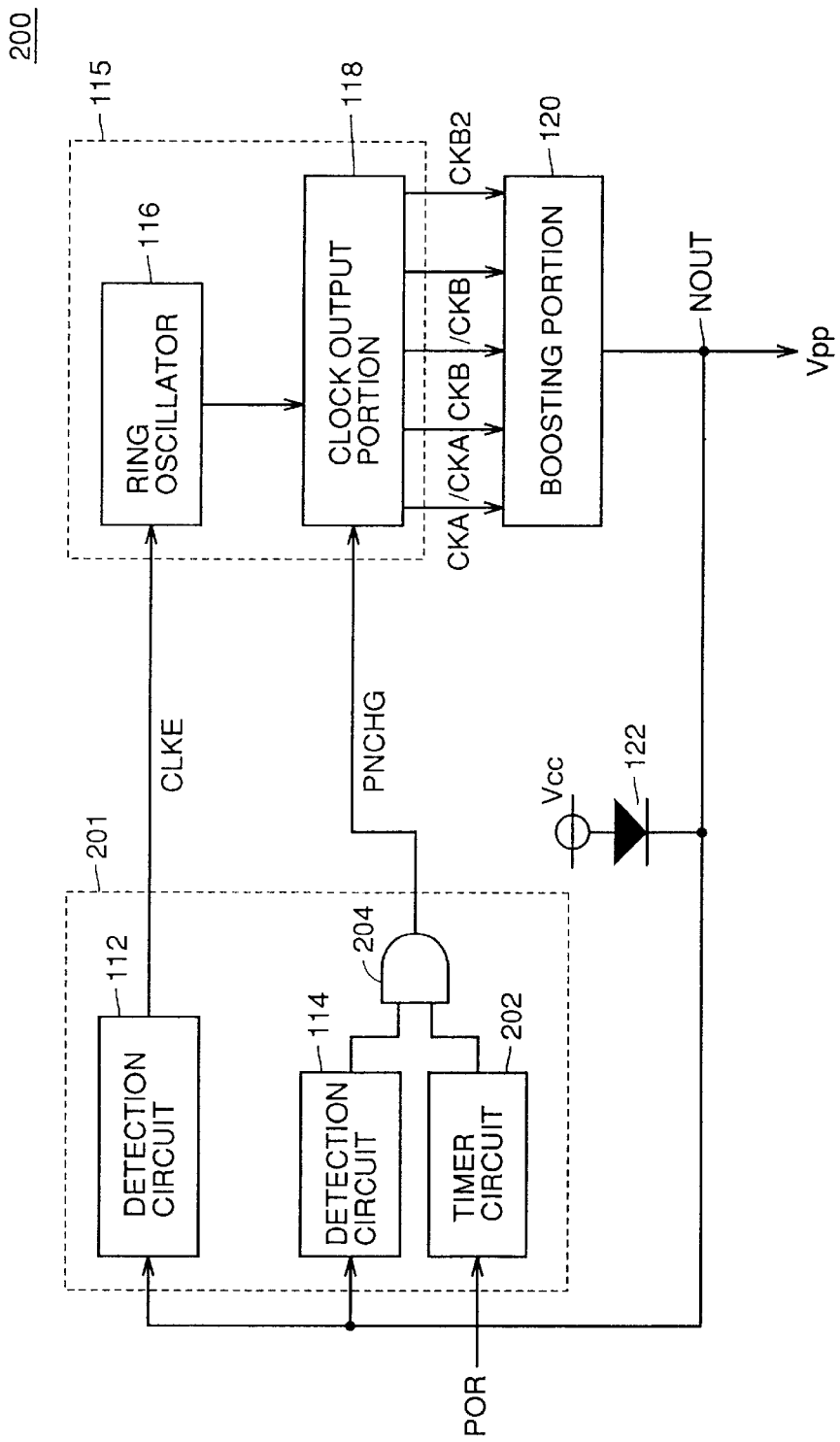
FIG. 15 is a block diagram showing a modification of the Vpp generation circuit.
Figure 16:
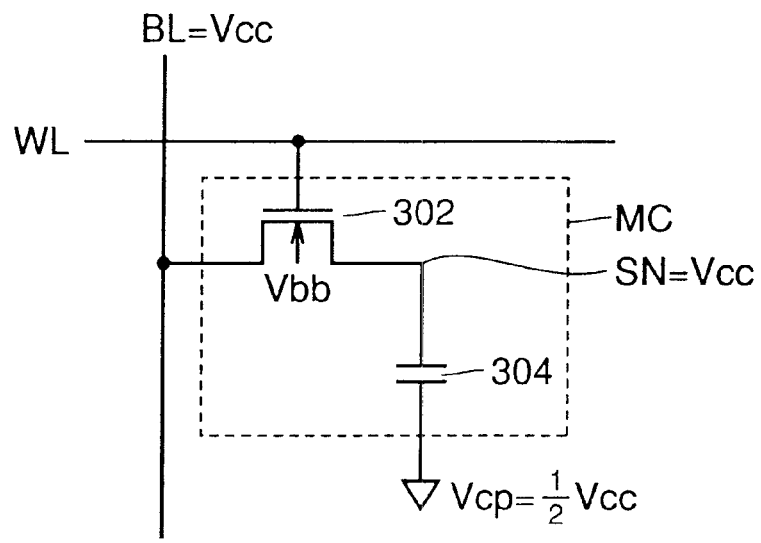
FIG. 16 is a diagram showing an arrangement of a memory cell of a DRAM.
Figure 17:
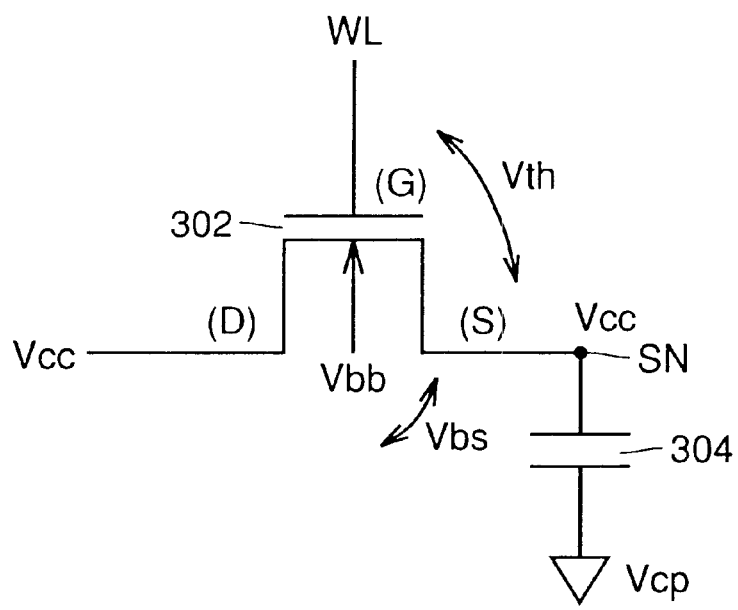
FIG. 17 is a diagram shown in configuration with a potential applied to an N channel MOS transistor 302 when data at an H level is written to the memory cell.
Figure 18:
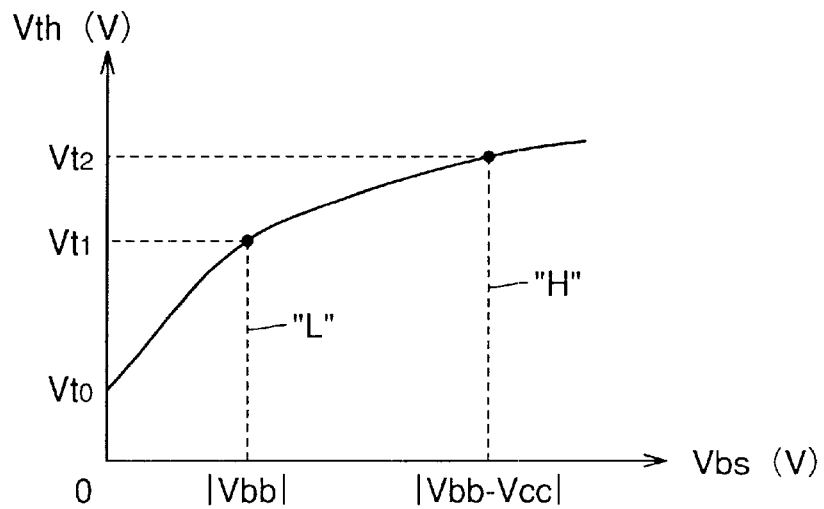
FIG. 18 is a graph showing a relationship between a substrate bias voltage Vbs and a threshold voltage Vth.
Figure 19:
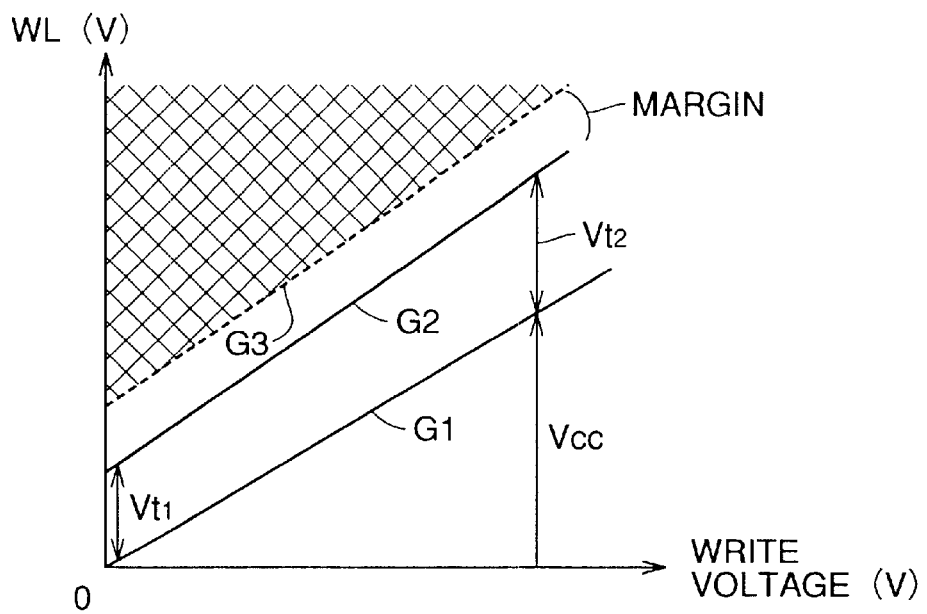
FIG. 19 is a graph showing a relationship between a voltage to be written to the memory cell and a potential for activating a word line required therefor.
Figure 20:
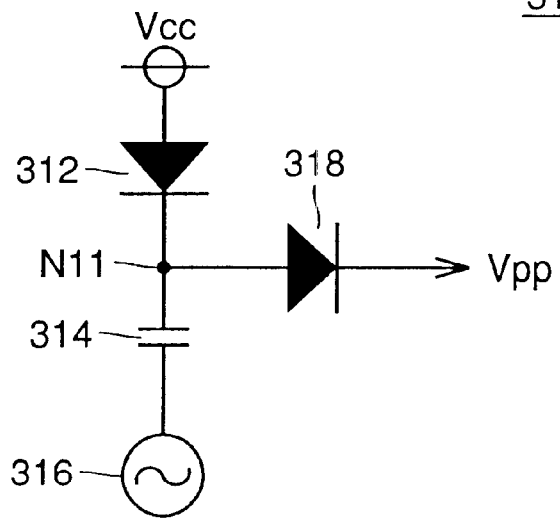
FIG. 20 is a diagram shown in conjunction with a basic principle of a conventional boost circuit generating boosted potential Vpp.
Figure 21:
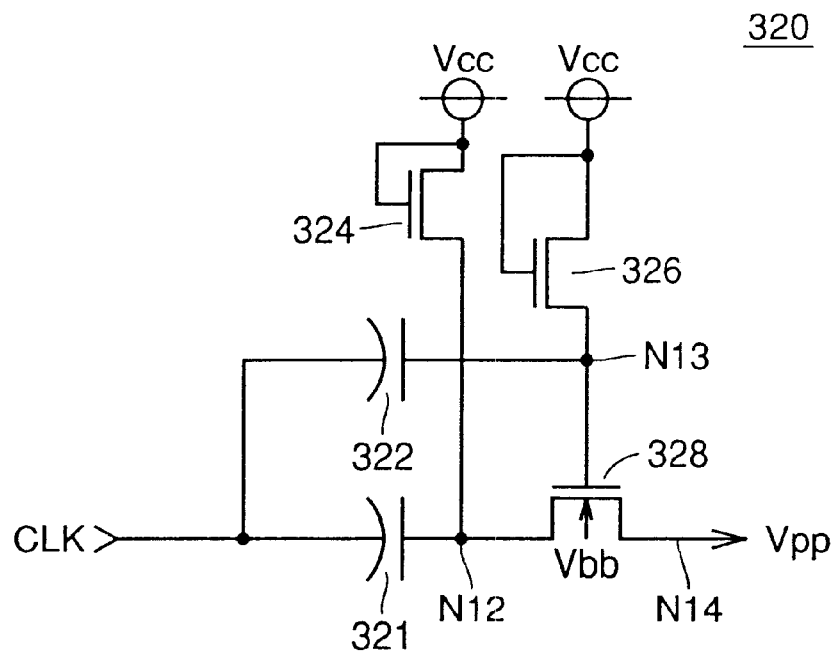
FIG. 21 is a circuit diagram showing an actual arrangement of the boost circuit.
Figure 22:
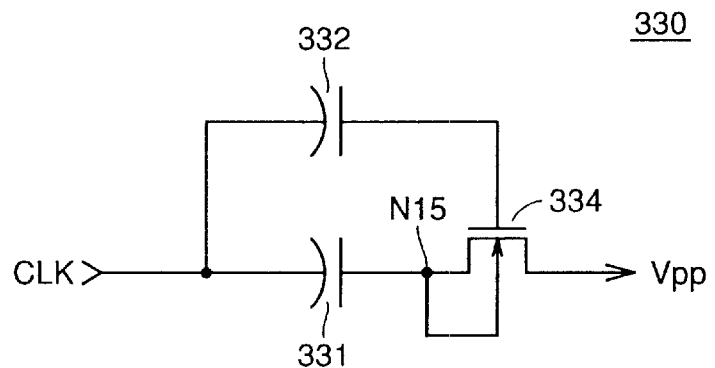
FIG. 22 is a circuit diagram showing an arrangement of a boost circuit 330.
Figure 23:
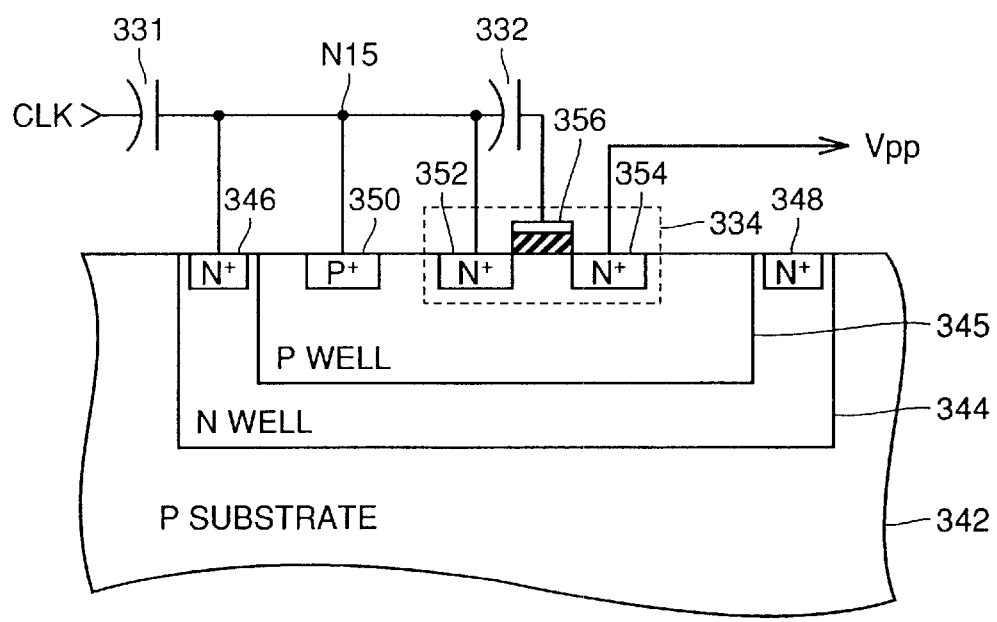
FIG. 23 is a cross sectional view showing an N channel MOS transistor 334.
Figure 24:
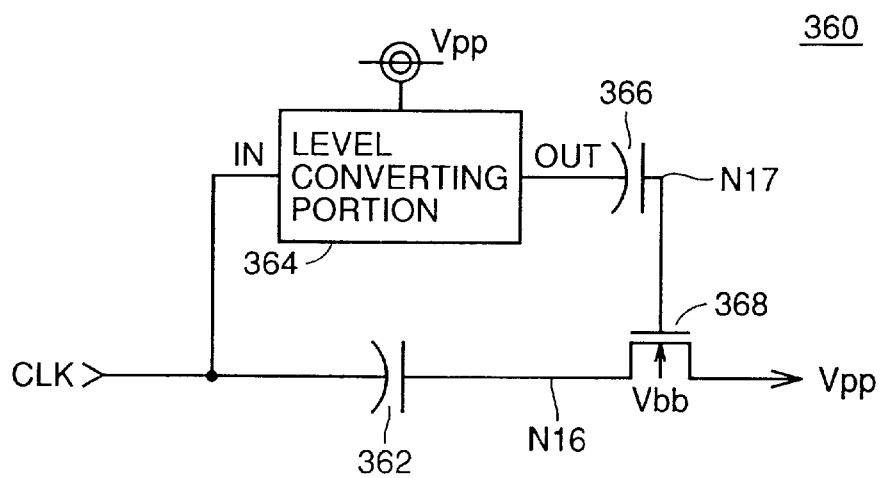
FIG. 24 is a circuit diagram showing an arrangement of a conventional boost circuit 360 capable of outputting a higher boosted potential.
Figure 25:
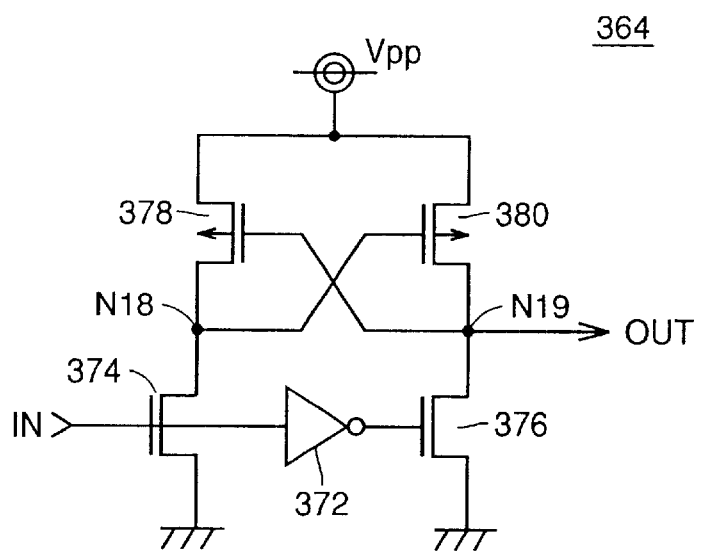
FIG. 25 is a circuit diagram showing an arrangement of a level converting portion 364 of FIG. 24.
Figure 26:
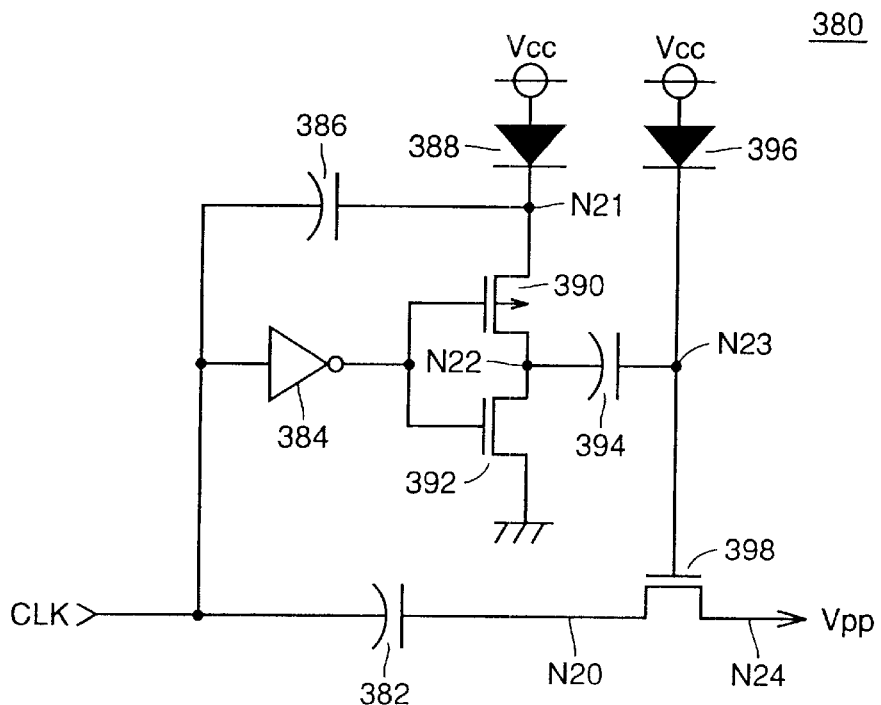
FIG. 26 is a circuit diagram showing an arrangement of another boost circuit 380 which is modified as in FIG. 24.
Figure 27:
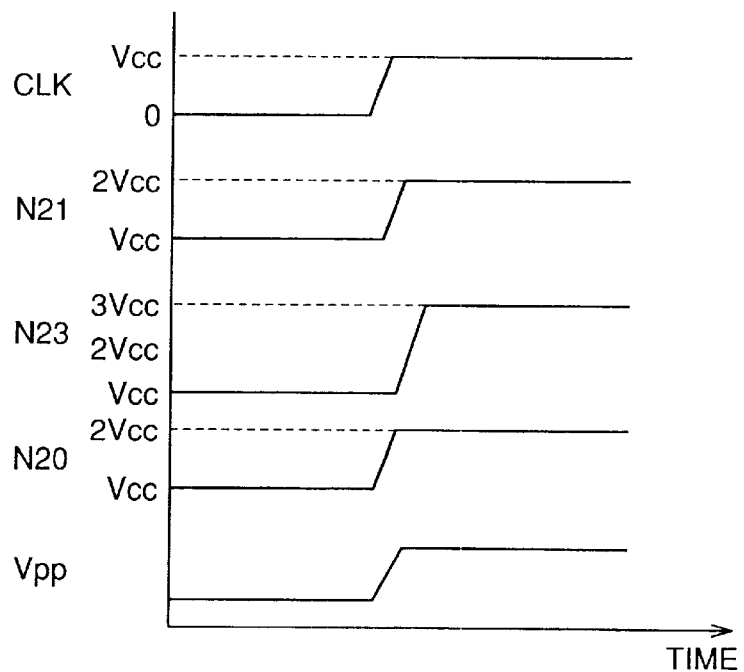
FIG. 27 is a diagram showing waveforms used for explaining the operation of boost circuit 380.
Figure 28:
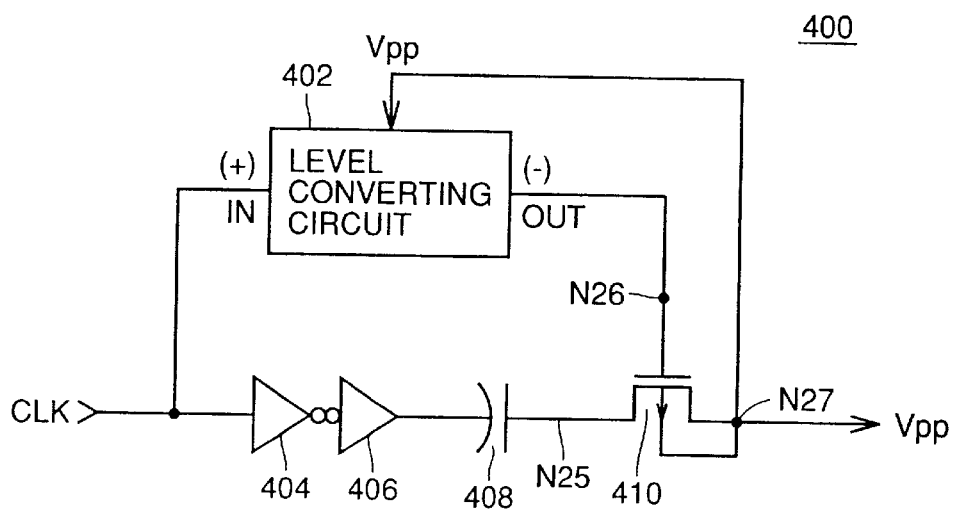
FIG. 28 is a circuit diagram showing an arrangement of boost circuit 400 which uses a P channel MOS transistor as a transistor at an output portion.
Figure 29:
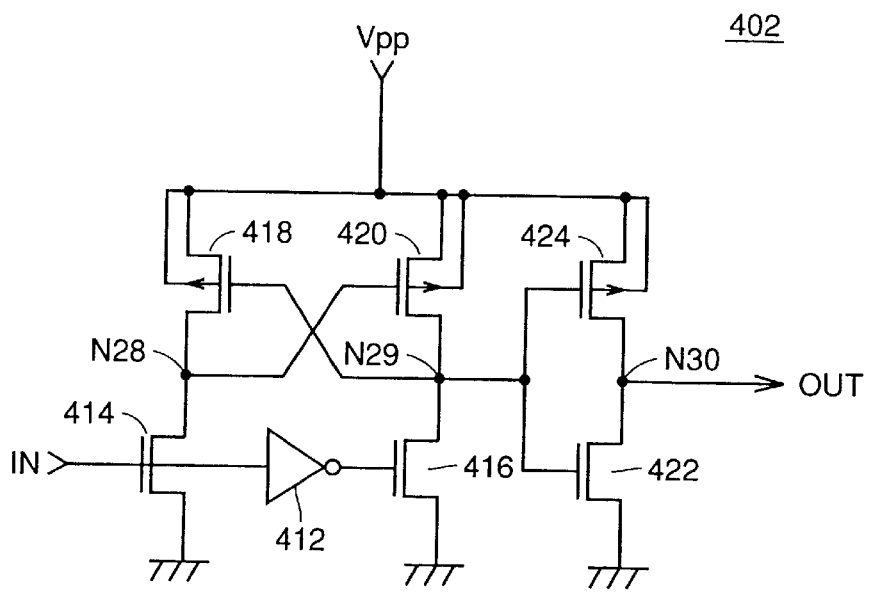
FIG. 29 is a circuit diagram showing an arrangement of a level converting circuit 402.
Figure 30:
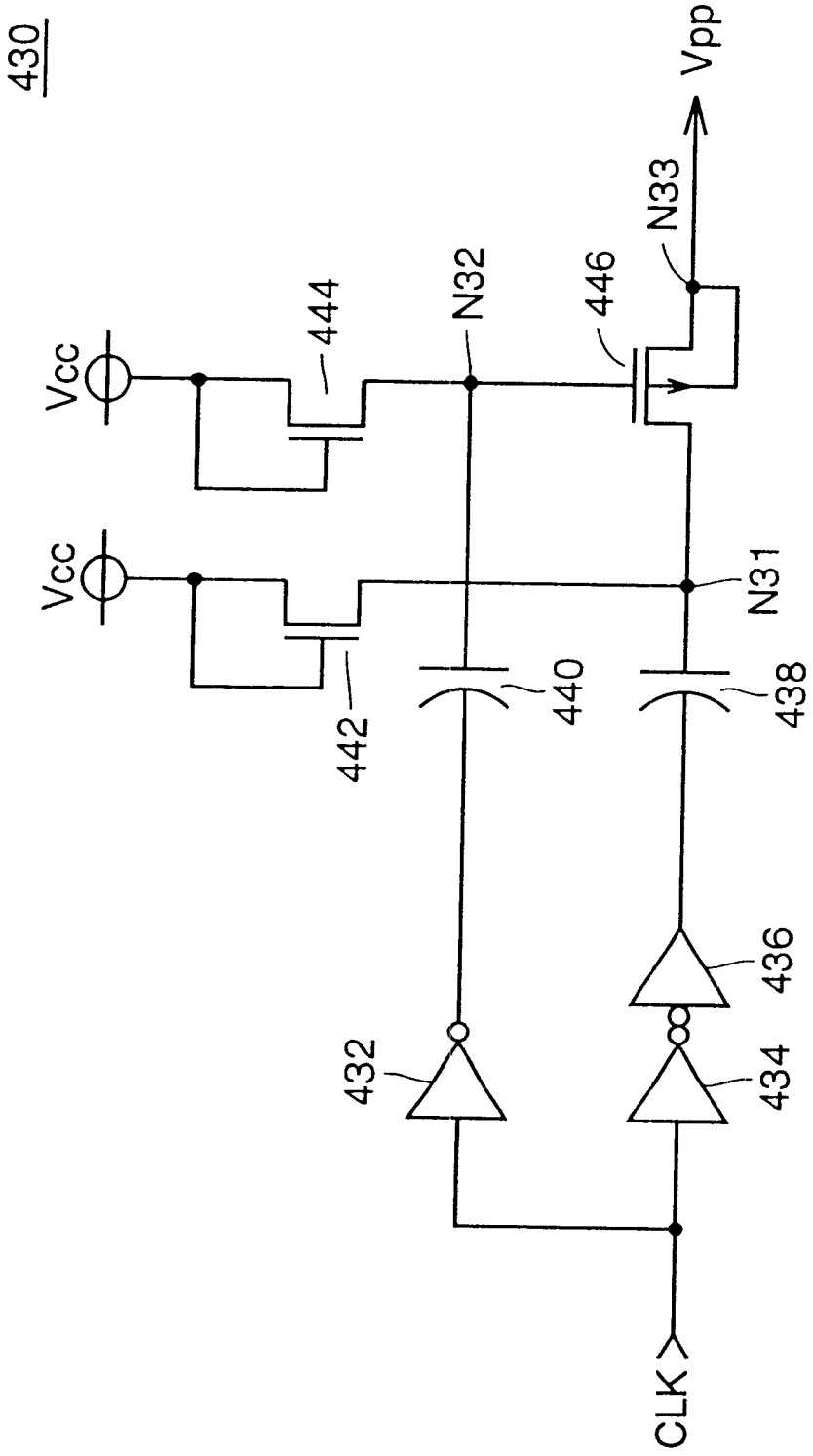
FIG. 30 is a circuit diagram showing an arrangement of another exemplary boost circuit 430 which uses a P channel MOS transistor at an output portion.
Figure 31:
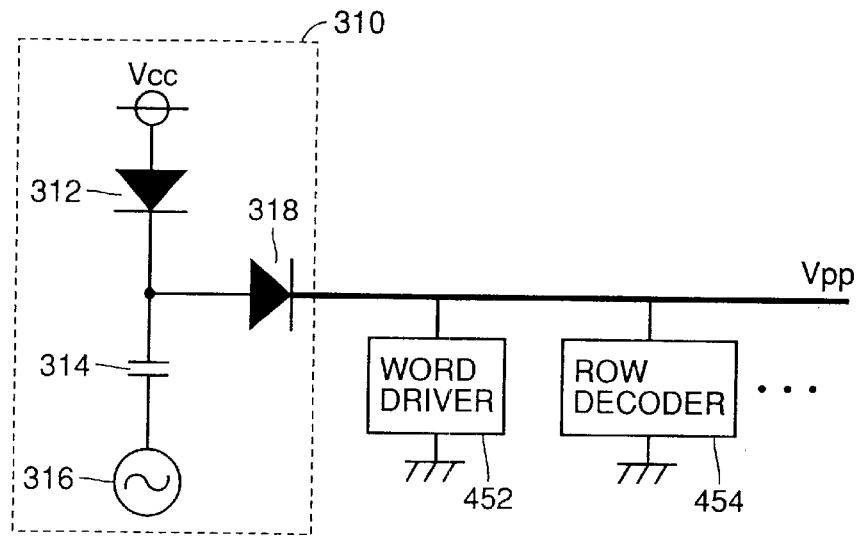
FIG. 31 is a schematic diagram shown in conjunction with a load circuit connected to the boost circuit.
Figure 32:
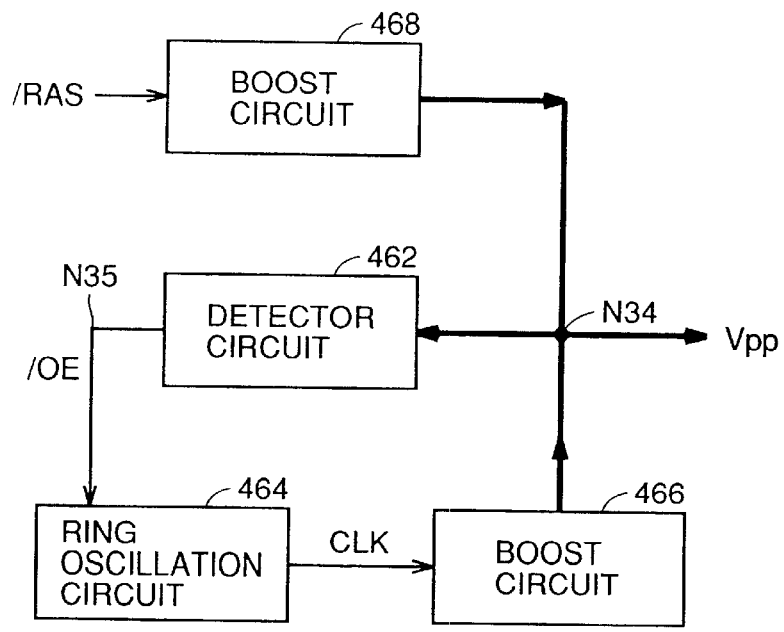
FIG. 32 is a block diagram showing an arrangement of generating boosted potential Vpp which is a conventionally employed.
Figure 33:
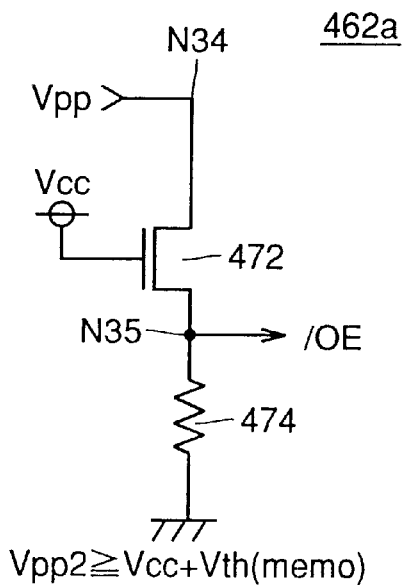
FIG. 33 is a circuit diagram showing a first example of a detector circuit 462 of FIG. 32.
Figure 34:
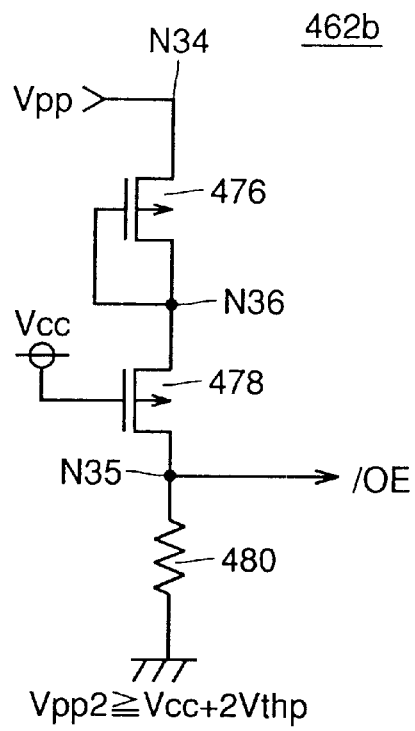
FIG. 34 is a circuit diagram showing a second example of detector circuit 462.
Figure 35:
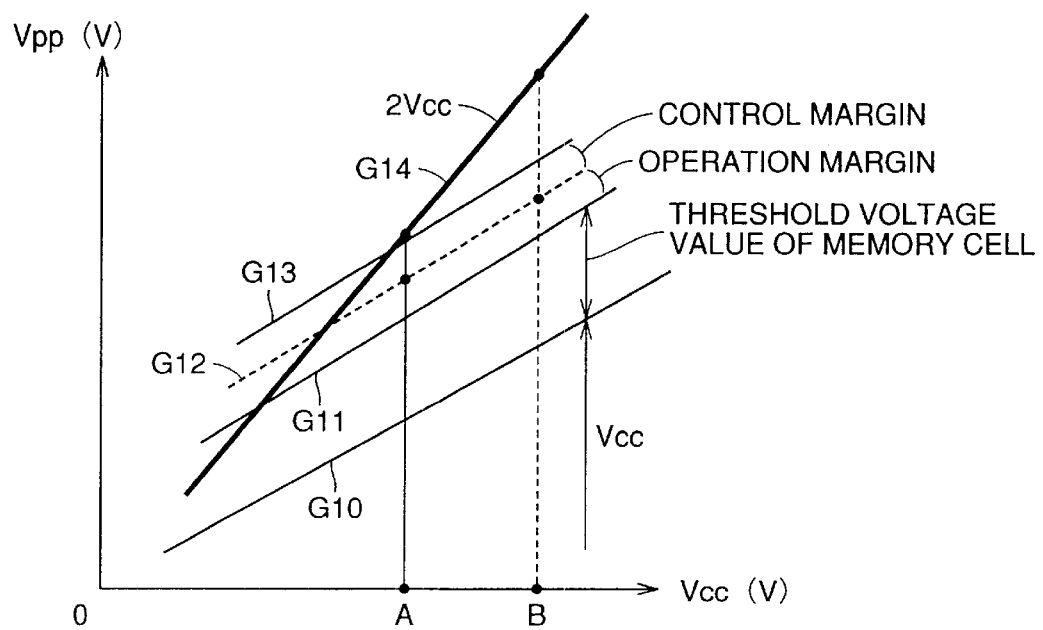
FIG. 35 is a graph showing a relationship between a power supply potential and a boosted potential.

FIG. 15 is a block diagram showing a modification of the Vpp generation circuit.

Referring to FIG. 15, Vpp generation circuit 200 includes a voltage detection circuit 201 in place of voltage detection circuit 111 in the structure of Vpp generation circuit 36 of FIG. 8.

Voltage detection circuit 201 includes, in addition to the structure of voltage detection circuit 111: a timer circuit 202 receiving a power on reset signal POR instructing reset when power is turned on for measuring a prescribed period of time; and an AND circuit 204 receiving outputs from detection circuit 114 and timer circuit 202 for outputting a switch signal PNCHG.

Boosted potential Vpp is in most cases not stabilized because the power consumption is not stabilized immediately after the power is turned on. Such a structure provides the following operation. Namely, boosted potential Vpp is generated by the driver transistor of the N channel MOS transistor to adjust a significant change in potential immediately after the power is turned on and, when boosted potential Vpp comes to stabilize after a prescribed period of time, the boosting operation as described above with reference to FIG. 14 is performed using the N and P channel MOS transistors.

As described above, when a high drivability is required due to a significant decrease in boosted potential Vpp, electric charges are supplied mainly by the driver transistor of the N channel MOS transistor with a carrier mobility twice that of the P channel MOS transistor. When boosted potential Vpp slightly decreases, a high potential can be maintained by the P channel MOS transistor with less drivability. Because the driver of the P channel MOS transistor is also used decrease in the a high boosted potential can be supplied without causing any voltage drop by the threshold voltage of the driver, which problem is often caused when the channel MOS transistor is used. Since the driver of the N channel MOS transistor needs not supply high boosted potential Vpp, there is no need to establish diode connection using a triple-well structure or to boost the gate potential in two stages. Thus, the circuit structure and process are simplified and the layout area can be reduced. In addition, since only the drive transistor of the P channel MOS transistor is not used, a smaller layout area of the driver portion is required to achieve a given supplying ability.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
    a voltage detecting portion detecting a potential at a first node supplied with a boosted potential;
    a clock signal generation circuit generating an source clock signal in accordance with an output from said voltage detecting portion; and
    a boosting portion boosting an externally applied external power supply potential in accordance with said source clock signal for applying said boosted potential to said first node, said boosting portion including:
        a precharge circuit precharging a second node to a prescribed potential,
        a boost circuit boosting a potential at said second node in accordance with said source clock signal,
        a first field effect transistor of a first conductivity type connected between said first and second nodes,
        a first drive circuit driving a gate potential of said first field effect transistor in accordance with said source clock signal,
        a second field effect transistor of a second conductivity type connected between said first and second nodes, and
        a second drive circuit driving a gate potential of said second field effect transistor in accordance with said source clock signal.

2. The semiconductor device according to claim 1, wherein said voltage detecting portion includes
    a first detection circuit instructing activation of said source clock signal when said boosted potential is at most a first potential, and
    a second detection circuit instructing switching from a first operation mode to a second operation mode when said boosted potential exceeds a second potential higher than said first potential, said clock signal generation circuit includes a clock oscillating portion generating said source clock signal in accordance with an output from said first detection circuit, and a clock output portion activating said first and second drive circuits in accordance with an output from said second detection circuit and said source clock signal, said clock output portion activating said first drive circuit in said first operation mode and activating said second drive circuit in said second operation mode.

3. The semiconductor device according to claim 2, wherein said first field effect transistor of said first conductivity type is an N channel MOS transistor, and said second field effect transistor of said second conductivity type is a P channel MOS transistor.

4. The semiconductor device according to claim 2, wherein said first field effect transistor can flow a current greater than that of said second field effect transistor.

5. The semiconductor device according to claim 2, wherein said first detection circuit includes a third field effect transistor diode-connected in a forward direction from said first node to a third node, a fourth field effect transistor connected between said third node and a fourth node and having a gate receiving said external power supply potential, and a first resistor connected between said fourth node and a ground node.

6. The semiconductor device according to claim 2, wherein said second detection circuit includes a potential generation circuit receiving said external power supply potential for outputting a potential lower than said external power supply potential, a fifth field effect transistor connected between said first node and a fifth node and having a gate receiving an output from said potential generation circuit, and a second resistor connected between said fifth node and a ground node.

7. The semiconductor device according to claim 1, wherein said boost circuit includes a capacitor having one end of which potential changes in accordance with said source clock signal and an other end connected to said second node.

8. The semiconductor device according to claim 1, wherein said second detection circuit includes a timer circuit measuring a prescribed period of time and maintaining a first operation mode for said prescribed period of time when power is turned on, a voltage detecting portion detecting a fact that said boosted potential exceeds said second potential, and an output portion instructing to change the operation mode in accordance with outputs from said timer circuit and said voltage detecting portion.

9. The semiconductor device according to claim 1, further comprising:

a memory array including a plurality of memory cells arranged in a matrix and holding data;

a plurality of word lines arranged corresponding to rows of said plurality of memory cells; and a row selection circuit selecting the rows of said memory array in accordance with an address signal, wherein said row selection circuit includes a row decoder selecting the row corresponding to said address signal, and a word line drive circuit activating said word line corresponding to the row of said memory cells selected by said row decoder to said boosted potential.

* * * * *